United States Patent
Takahashi

(10) Patent No.: US 10,902,790 B2
(45) Date of Patent: Jan. 26, 2021

(54) SEMICONDUCTOR DEVICE, DISPLAY PANEL, DISPLAY DEVICE, INPUT/OUTPUT DEVICE, AND DATA PROCESSING DEVICE

(71) Applicant: Semiconductor Energy Laboratory Co., Ltd., Atsugi (JP)

(72) Inventor: Kei Takahashi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/480,081

(22) PCT Filed: Feb. 5, 2018

(86) PCT No.: PCT/IB2018/050690
§ 371 (c)(1),
(2) Date: Jul. 23, 2019

(87) PCT Pub. No.: WO2018/150290
PCT Pub. Date: Aug. 23, 2018

(65) Prior Publication Data
US 2019/0371249 A1 Dec. 5, 2019

(30) Foreign Application Priority Data

Feb. 16, 2017 (JP) .................................. 2017-027201

(51) Int. Cl.
*G09G 3/3275* (2016.01)
*G09G 3/36* (2006.01)
(Continued)

(52) U.S. Cl.
CPC ......... *G09G 3/3275* (2013.01); *G09G 3/3225* (2013.01); *G09G 3/3688* (2013.01);
(Continued)

(58) Field of Classification Search
CPC .. G09G 3/3275; G09G 3/3688; G09G 3/2092; G09G 3/3291; G09G 3/3233;
(Continued)

(56) References Cited

U.S. PATENT DOCUMENTS 5,394,112 A   2/1995 Alini et al.
6,420,988 B1  7/2002 Azami et al.
(Continued)

FOREIGN PATENT DOCUMENTS

CN   101840676 A   9/2010
EP     2211331 A   7/2010
(Continued)

OTHER PUBLICATIONS

International Search Report (Application No. PCT/IB2018/050690) dated May 22, 2018.

(Continued)

*Primary Examiner* — Yaron Cohen
(74) *Attorney, Agent, or Firm* — Robinson Intellectual Property Law Office; Eric J. Robinson

(57) ABSTRACT

A novel semiconductor device with high convenience or high reliability is provided. The semiconductor device includes an arithmetic logic unit and an amplifier. The arithmetic logic unit is configured to generate second data on the basis of an offset adjustment signal or offset data and first data. The amplifier includes an operational amplifier and an offset adjustment circuit including a register. The operational amplifier supplies a predetermined voltage to a node on the basis of a voltage between a first terminal and a second terminal. The register is configured to retain, as the offset data, the offset adjustment signal on the basis of a latch signal. The register is configured to allow the supplied offset adjustment signal to pass therethrough in a passage state and (Continued)

supply the offset adjustment signal. The register is configured to supply the offset data in a non-passage state.

18 Claims, 20 Drawing Sheets

(51) Int. Cl.
| | |
|---|---|
| *G09G 3/3225* | (2016.01) |
| *H03F 3/45* | (2006.01) |
| *H01L 27/12* | (2006.01) |
| *G02F 1/1362* | (2006.01) |
| *G02F 1/1368* | (2006.01) |
| *G09G 3/32* | (2016.01) |
| *H01L 27/32* | (2006.01) |
| *H03M 1/74* | (2006.01) |

(52) U.S. Cl.
CPC ....... *H01L 27/124* (2013.01); *H03F 3/45071* (2013.01); *G02F 1/1368* (2013.01); *G02F 1/136286* (2013.01); *G09G 3/32* (2013.01); *G09G 2310/027* (2013.01); *G09G 2310/0289* (2013.01); *G09G 2310/0291* (2013.01); *G09G 2320/0247* (2013.01); *G09G 2320/10* (2013.01); *G09G 2330/021* (2013.01); *G09G 2340/0435* (2013.01); *G09G 2354/00* (2013.01); *H01L 27/3276* (2013.01); *H03F 2200/129* (2013.01); *H03F 2200/156* (2013.01); *H03F 2200/375* (2013.01); *H03F 2203/45116* (2013.01); *H03F 2203/45536* (2013.01); *H03M 1/74* (2013.01)

(58) Field of Classification Search
CPC .......... G09G 3/20; G09G 3/3225; G09G 3/36; G09G 2310/027; G09G 2360/144; G09G 2310/0291; G09G 2310/0281; G09G 2330/021; G09G 2300/0426; G09G 2340/0435; G09G 3/32; G09G 2310/0289; G09G 2320/10; G09G 2354/00; G09G 2320/0247; H01L 27/124; H01L 27/3276; H01L 27/32; H03F 3/45071; H03F 2203/45116; H03F 2200/129; H03F 2203/45536; H03F 2200/156; H03F 2200/375; H03M 1/10; H03M 1/74; H03M 1/76; G02F 1/1368; G02F 1/136286

See application file for complete search history.

(56) References Cited

U.S. PATENT DOCUMENTS

| | | | |
|---|---|---|---|
| 6,606,045 | B2 | 8/2003 | Azami et al. |
| 9,614,094 | B2 | 4/2017 | Watanabe |
| 2005/0140630 | A1 | 6/2005 | Kikuchi et al. |
| 2007/0034876 | A1* | 2/2007 | Yamazaki ........... H01L 27/1237 257/66 |
| 2008/0252504 | A1 | 10/2008 | Jeong et al. |
| 2009/0224746 | A1 | 9/2009 | Nishizono |
| 2010/0141493 | A1 | 6/2010 | Cho et al. |
| 2010/0156867 | A1 | 6/2010 | Kim et al. |
| 2010/0182299 | A1 | 7/2010 | Hyoudou et al. |
| 2015/0179125 | A1 | 6/2015 | Choi et al. |
| 2016/0241255 | A1 | 8/2016 | Takahashi |
| 2017/0053584 | A1 | 2/2017 | Takahashi |
| 2017/0154560 | A1 | 6/2017 | Takahashi |
| 2017/0186355 | A1 | 6/2017 | Takahashi et al. |
| 2017/0263205 | A1 | 9/2017 | Takahashi |
| 2017/0372672 | A1 | 12/2017 | Shiomi |
| 2018/0053477 | A1 | 2/2018 | Takahashi |
| 2018/0131336 | A1 | 5/2018 | Kwak et al. |
| 2018/0226034 | A1 | 8/2018 | Takahashi |

FOREIGN PATENT DOCUMENTS

| | | |
|---|---|---|
| JP | 2001-223584 A | 8/2001 |
| JP | 2010-171627 A | 8/2010 |
| KR | 10-0857122 | 9/2008 |
| KR | 2010-0085835 A | 7/2010 |
| KR | 2015-0074581 A | 7/2015 |
| TW | 201030358 | 8/2010 |
| WO | WO-2016/117390 | 7/2016 |

OTHER PUBLICATIONS

Written Opinion (Application No. PCT/IB2018/050690) dated May 22, 2018.

* cited by examiner

SEMICONDUCTOR DEVICE, DISPLAY PANEL, DISPLAY DEVICE, INPUT/OUTPUT DEVICE, AND DATA PROCESSING DEVICE

TECHNICAL FIELD

One embodiment of the present invention relates to a semiconductor device, a display panel, a display device, an input/output device, or a data processing device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

There has been a trend toward higher performance (e.g., multiple gray levels and higher definition) of display devices. To meet the demand for higher performance, an integrated circuit (IC, hereinafter also referred to as driver IC) is used as a driver circuit of a display device, particularly as a source driver.

A driver IC includes a grayscale voltage generation circuit for generating an analog signal supplied to pixels. The grayscale voltage generation circuit is a digital-to-analog (D/A) converter circuit, which generates an analog signal based on a digital signal.

As the D/A converter circuit, a resistor digital-to-analog converter (R-DAC), in which resistors are provided in series, is used in consideration of the requirement of high response speed. The number of switches in an R-DAC increases exponentially with the increase in the number of bits of digital signals; thus, the circuit area of a driver IC increases.

In view of the above, Patent Documents 1 to 3 suggest a structure for obtaining a desired analog signal in such a manner that a digital signal of an upper bit and a digital signal of a lower bit are independently converted to synthesize respective analog signals.

REFERENCE

Patent Document

[Patent Document 1] United States Patent Application Publication No. 2005/0140630
[Patent Document 2] United States Patent Application Publication No. 2010/0156867
[Patent Document 3] United States Patent Application Publication No. 2010/0141493

DISCLOSURE OF INVENTION

An object of one embodiment of the present invention is to provide a novel semiconductor device with high convenience or high reliability. Another object is to provide a novel display panel with high convenience or high reliability. Another object is to provide a novel display device with high convenience or high reliability. Another object is to provide a novel input/output device with high convenience or high reliability. Another object is to provide a novel data processing device with high convenience or high reliability. Another object is to provide a novel display panel, a novel display device, a novel input/output device, a novel data processing device, or a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device including an arithmetic logic unit, a first D/A converter circuit, and an amplifier.

The arithmetic logic unit is configured to generate second data on the basis of an offset adjustment signal and first data. The arithmetic logic unit is configured to generate the second data on the basis of offset data and the first data.

The first D/A converter circuit is configured to supply an analog signal on the basis of the second data. The first D/A converter circuit is electrically connected to the amplifier.

The amplifier is configured to supply the offset adjustment signal and the offset data.

(2) Another embodiment of the present invention is the above semiconductor device in which the amplifier includes an operational amplifier, a first terminal, a second terminal, a node, a switch, and an offset adjustment circuit.

The operational amplifier is electrically connected to the first terminal, the second terminal, and the node. The operational amplifier is configured to supply a first voltage to the node on the basis of a voltage between the first terminal and the second terminal.

The switch is electrically connected to the node and the second terminal. The switch is configured to break an electrical connection between the node and the second terminal when an output enable signal is in a first state. The switch is configured to establish an electrical connection between the node and the second terminal when the output enable signal is in a second state.

The offset adjustment circuit is electrically connected to the node. The offset adjustment circuit is configured to allow the offset adjustment signal to pass therethrough and supply the offset data.

(3) Another embodiment of the present invention is the above semiconductor device in which the offset adjustment circuit includes a level shifter and a register.

The level shifter is electrically connected to the node and the register. The level shifter is configured to supply a latch signal in a first state or a second state on the basis of the potential of the node when the output enable signal is in the first state. The level shifter is configured to supply the latch signal in the first state when the output enable signal is in the second state.

The register is configured to be supplied with the offset adjustment signal, a reset signal, and the latch signal. The register is configured to retain, as the offset data, the offset adjustment signal at the time when the register is supplied with the latch signal in the second state. The register is configured to allow the supplied offset adjustment signal to pass therethrough in a passage state and supply the offset adjustment signal. The register is configured to supply the offset data in a non-passage state.

Thus, the offset data is added to the first data, whereby the second data can be generated. When the switch is off, the offset data with which the potential of the node becomes closer to the potential of the second terminal can be identified. The second data can be generated such that the potential of the node is closer to the potential of the second terminal. The potential of the node can be made closer to the potential of the second terminal. When the switch is on, a current flowing through the node can be suppressed. A bias current that flows in the semiconductor device can be reduced. Power loss of the semiconductor device can be reduced. Thus, a novel semiconductor device with high convenience or high reliability can be provided.

(4) Another embodiment of the present invention is the above semiconductor device further including a first selection circuit.

The first selection circuit is configured to supply a first selection signal. The amplifier has a third terminal. The offset adjustment circuit includes a tri-state buffer.

The tri-state buffer is electrically connected to the register and the third terminal. The tri-state butter is brought into a high impedance state when the first selection signal is in a first state. The tri-state butter allows the offset adjustment signal to pass therethrough and supplies the offset data when the first selection signal is in a second state.

Thus, for example, one offset adjustment circuit can be selected from a plurality of offset adjustment circuits using the first selection signal. The offset data can be supplied on the basis of the first selection signal. Thus, a novel semiconductor device with high convenience or high reliability can be provided.

(5) Another embodiment of the present invention is the above semiconductor device further including a second selection circuit and a latch circuit. The second selection circuit is configured to supply a second selection signal.

The latch circuit is electrically connected to the arithmetic logic unit and the first D/A converter circuit. The latch circuit retains the second data when being supplied with the second selection signal. The latch circuit supplies the second data in a non-passage state.

Thus, for example, one latch circuit can be selected from a plurality of latch circuits with use of the second selection signal. The second data can be stored in the latch circuit on the basis of the second selection signal. Thus, a novel semiconductor device with high convenience or high reliability can be provided.

(6) Another embodiment of the present invention is the above semiconductor device further including a terminal region.

The terminal region includes one group of terminals arranged in the row direction. The one group of terminals include a terminal electrically connected to the second terminal.

With the above structure, an analog signal obtained by converting a digital signal to have a predetermined voltage can be supplied. An analog signal into which a digital signal is converted can be supplied to one group of signal lines arranged in the row direction through the one group of terminals, for example. A bias current that flows through the second terminal can be reduced. Power loss of the semiconductor device can be reduced. Thus, a novel semiconductor device with high convenience or high reliability can be provided.

(7) Another embodiment of the present invention is the above semiconductor device further including a buffer amplifier. The buffer amplifier has a fourth terminal and a fifth terminal.

The first D/A converter circuit has a first output terminal and a second output terminal. The first output terminal is electrically connected to the first terminal. The second output terminal is electrically connected to the fourth terminal.

The one group of terminals include a terminal electrically connected to the fifth terminal.

(8) Another embodiment of the present invention is the above semiconductor device in which the terminal region includes one or a plurality of first regions.

In the terminal region, the number of the first regions is equal to the number of second regions. The first regions and the second regions are alternately provided in the terminal region.

The first region includes a terminal electrically connected to the second terminal. The second region includes a terminal electrically connected to the fifth terminal.

Thus, an analog signal obtained by converting a digital signal to have a predetermined voltage can be supplied to the one group of signal lines arranged in the row direction through the one group of terminals. A bias current that flows through the second terminal provided in the first region can be reduced. Power loss of the semiconductor device can be reduced. Thus, a novel semiconductor device with high convenience or high reliability can be provided.

(9) Another embodiment of the present invention is a display panel including a display region and any of the above semiconductor devices.

The display region includes one group of pixels, another group of pixels, a scan line, and a signal line.

The one group of pixels are arranged in the row direction, and the other group of pixels are arranged in a column direction intersecting the row direction. The scan line is electrically connected to the one group of pixels.

The signal line is electrically connected to the other group of pixels. The signal line is electrically connected to the second terminal.

With the above structure, an analog signal obtained by converting a digital signal to have a predetermined voltage can be supplied to one signal line. An analog signal into which a digital signal is converted can be supplied to the other group of pixels. A bias current that flows through the second terminal can be reduced. Power loss of the display panel can be reduced. Thus, a novel display panel with high convenience or high reliability can be provided.

(10) Another embodiment of the present invention is the above display panel further including a second semiconductor device.

The second semiconductor device includes a second D/A converter circuit and a buffer amplifier. The buffer amplifier has a sixth terminal and a seventh terminal.

The sixth terminal is electrically connected to the second D/A converter circuit. The seventh terminal is electrically connected to the signal line.

The signal line includes a portion electrically connected to the other group of pixels between a portion electrically connected to the second terminal and a portion electrically connected to the seventh terminal.

Thus, an analog signal can be supplied from both ends of one signal line to the other group of pixels. An influence of the parasitic resistance of one signal line on an analog signal can be reduced. An influence of the parasitic capacitance of one signal line on an analog signal can be reduced. The signal line can be charged and discharged at high speed, resisting its parasitic resistance and parasitic capacitance. Heat generated due to charge and discharge can be dispersed. A bias current that flows between the semiconductor device electrically connected to one end of one signal line and the buffer amplifier electrically connected to the other end of the one signal line can be reduced. Power loss of the display panel can be reduced. Thus, a novel display panel with high convenience or high reliability can be provided.

(11) Another embodiment of the present invention is the above display panel in which the display region includes the plurality of pixels in a matrix. The display region includes 7600 or more pixels in the row direction. The display region includes 4300 or more pixels in the column direction.

With the above structure, an image signal with reduced degradation can be supplied to the pixels whose number is larger than that of pixels for a high definition image or a 4K image, for example. An image signal with reduced degradation can be supplied to the pixels at high speed. An image with high resolution can be displayed. Display can be performed at a refresh rate of 60 Hz or higher, preferably 120 Hz or higher. Thus, a novel display panel with high convenience or high reliability can be provided.

(12) Another embodiment of the present invention is the above display panel in which the display region includes a first pixel, a second pixel, and a third pixel.

The first pixel represents a color having, on the CIE 1931 chromaticity coordinates, a chromaticity x of greater than 0.680 and less than or equal to 0.720 and a chromaticity y of greater than or equal to 0.260 and less than or equal to 0.320.

The second pixel represents a color having, on the CIE 1931 chromaticity coordinates, a chromaticity x of greater than or equal to 0.130 and less than or equal to 0.250 and a chromaticity y of greater than 0.710 and less than or equal to 0.810.

The third pixel represents a color having, on the CIE 1931 chromaticity coordinates, a chromaticity x of greater than or equal to 0.120 and less than or equal to 0.170 and a chromaticity y of greater than or equal to 0.020 and less than 0.060.

(13) Another embodiment of the present invention is a display device including any of the above display panels and a control portion.

The control portion is supplied with image data and control data. The control portion generates data on the basis of the image data. The control portion supplies the first data.

The first data contains a gray scale of 12 bits or more. The display panel is supplied with the first data. The scan line is supplied with a selection signal at a frequency of 60 Hz or higher. The display element performs display on the basis of the data.

With such a structure, image data can be displayed using the display element. Thus, a novel display device with high convenience or high reliability can be provided.

(14) Another embodiment of the present invention is an input/output device including an input portion and a display portion. The display portion includes any of the above display panels.

The input portion includes a sensing region and senses an object approaching the sensing region. The sensing region includes a region overlapping with the pixel.

With such a structure, an object approaching the region overlapping with the display portion can be sensed while image data is displayed by the display portion. A finger or the like that approaches the display portion can be used as a pointer to input positional data. Positional data can be associated with image data displayed on the display portion. As a result, a novel input/output device with high convenience or high reliability can be provided.

(15) Another embodiment of the present invention is a data processing device including at least one of a keyboard, a hardware button, a pointing device, a touch sensor, an illuminance sensor, an imaging device, an audio input device, an eye-gaze input device, and an attitude determination device, and any of the above display panels.

Thus, an arithmetic logic unit can generate the image data or the control data on the basis of the data which is supplied using a variety of input devices. As a result, a novel data processing device with high convenience or high reliability can be provided.

Although the block diagram attached to this specification shows components classified by their functions in independent blocks, it is difficult to classify actual components according to their functions completely and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

Note that in this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

Note that in this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where a current, a voltage, or a potential can be supplied or transmitted. Accordingly, connection means not only direct connection but also indirect connection through a circuit element such as a wiring, a resistor, a diode, or a transistor so that a current, a potential, or a voltage can be supplied or transmitted.

In this specification, even when different components are connected to each other in a circuit diagram, there is actually a case where one conductive film has functions of a plurality of components such as a case where part of a wiring serves as an electrode. In this specification, the term "connection" also means such a case where one conductive film has functions of a plurality of components.

Furthermore, in this specification, one of a first electrode and a second electrode of a transistor refers to a source electrode and the other refers to a drain electrode.

According to one embodiment of the present invention, a novel semiconductor device with high convenience or high reliability can be provided. According to one embodiment of the present invention, a novel display panel with high convenience or high reliability can be provided. According to one embodiment of the present invention, a novel display device with high convenience or high reliability can be provided. According to one embodiment of the present invention, a novel input/output device with high convenience or high reliability can be provided. According to one embodiment of the present invention, a novel data processing device with high convenience or high reliability can be provided. According to one embodiment of the present invention, a novel display panel, a novel display device, a novel input/output device, a novel data processing device, or a novel semiconductor device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 14A, 14B1, 14B2, and 14B3 are a block diagram and perspective views illustrating the structure of a display device of an embodiment.

BEST MODE FOR CARRYING OUT THE INVENTION

Figure 1A:
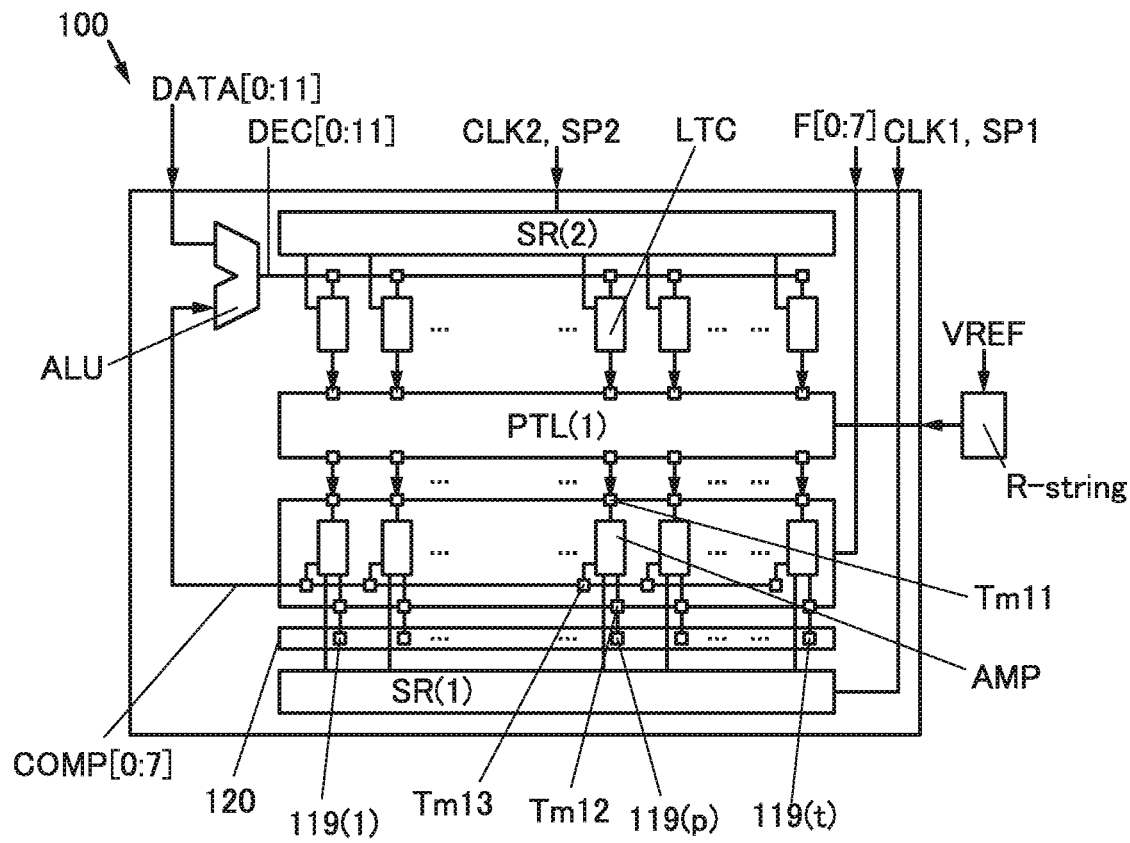
FIGS. 1A and 1B are block diagrams illustrating the structure of a semiconductor device of an embodiment.

One embodiment of the present invention is a semiconductor device including an arithmetic logic unit and an amplifier. The arithmetic logic unit is configured to generate second data on the basis of an offset adjustment signal or offset data and first data. The amplifier includes an operational amplifier, a first terminal, a second terminal, a node, a switch, and an offset adjustment circuit. The operational amplifier is configured to supply a first voltage to the node on the basis of a voltage between the first terminal and the second terminal. The offset adjustment circuit is electrically connected to the node and includes a level shifter and a register. The register is configured to be supplied with the offset adjustment signal, the reset signal, and a latch signal; retain, as offset data, an offset adjustment signal at the time when the latch signal in a second state is supplied to the register; allow the offset adjustment signal to pass therethrough in a passage state and supply the offset adjustment signal; and supply the offset data in a non-passage state.

Thus, the offset data is added to the first data, whereby the second data can be generated. When the switch is off, the offset data with which the potential of the node becomes closer to the potential of the second terminal can be identified. The second data can be generated such that the potential of the node is closer to the potential of the second terminal. The potential of the node can be made closer to the potential of the second terminal. When the switch is on, a current flowing through the node can be suppressed. A bias current that flows in the semiconductor device can be reduced. Power loss of the semiconductor device can be reduced. Thus, a novel semiconductor device with high convenience or high reliability can be provided.

Embodiments will be described in detail with reference to the drawings. Note that one embodiment of the present invention is not limited to the following description. It will be readily appreciated by those skilled in the art that modes and details of the present invention can be modified in various ways without departing from the spirit and scope of the present invention.

Thus, the present invention should not be construed as being limited to the description in the following embodiments. Note that in structures of the present invention described below, the same portions or portions having similar functions are denoted by the same reference numerals in different drawings, and a description thereof is not repeated.

Embodiment 1

In this embodiment, structures of semiconductor devices of embodiments of the present invention are described with reference to FIGS. 1A and 1B, FIG. 2, and FIGS. 3A and 3B.

Figure 1B:
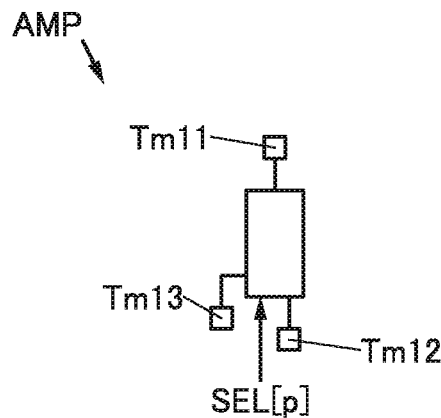

FIGS. 1A and 1B are block diagrams illustrating the structure of the semiconductor device of one embodiment of the present invention.

Figure 2:
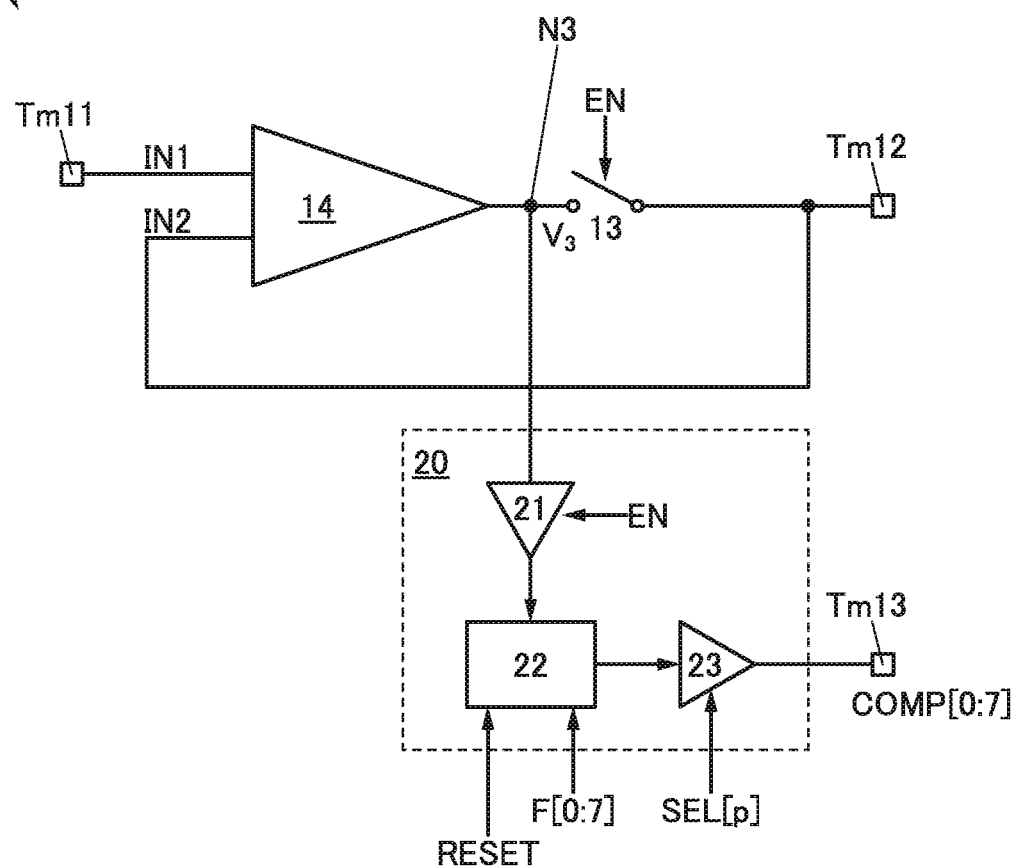
FIG. 2 is a block diagram illustrating the structure of an amplifier which can be used in a semiconductor device of an embodiment.

FIG. 2 is a block diagram illustrating the structure of an amplifier that can be used in the semiconductor device of one embodiment of the present invention.

Figure 3A:
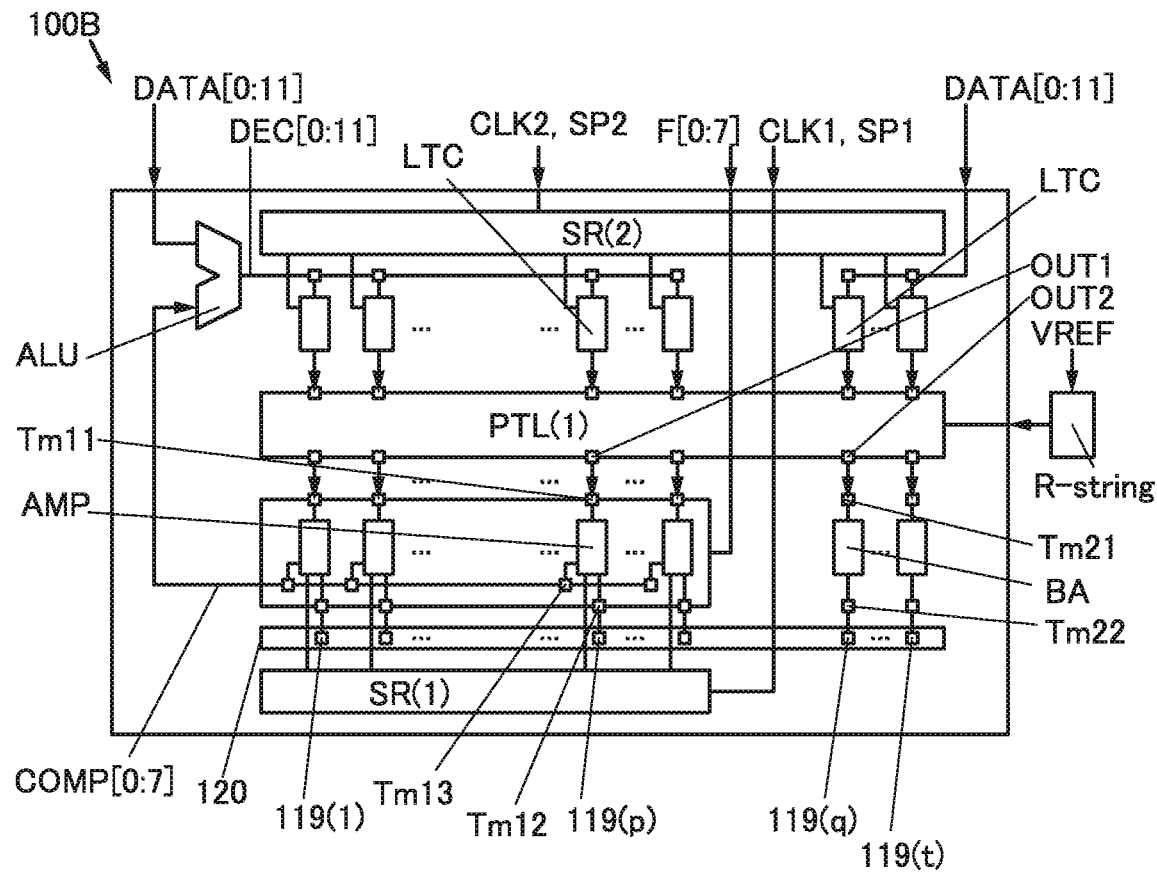
FIGS. 3A and 3B are block diagrams illustrating the structure of a semiconductor device of an embodiment.
Figure 3B:
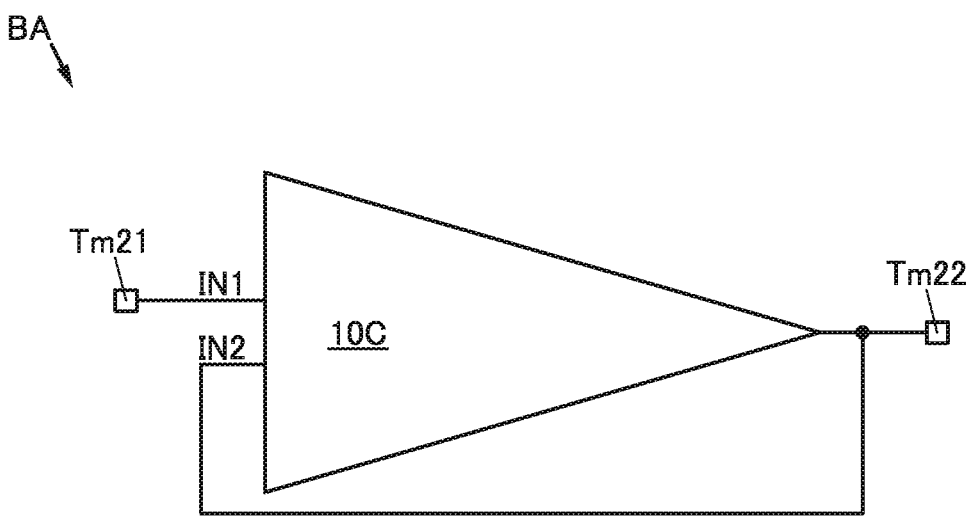

FIGS. 3A and 3B are block diagrams illustrating the structure of an amplifier that is different from that in FIG. 2 and can be used in the semiconductor device of one embodiment of the present invention.

Note that in this specification, an integral variable of 1 or more may be used for reference numerals. For example, "(p)" where p is an integral value of 1 or more may be used for part of a reference numeral that specifies any one of components (p components at a maximum). For another example, "(m, n)" where m and n are each an integral value of 1 or more may be used for part of a reference numeral that specifies any one of components (m×n components at a maximum).

Structure Example 1 of Semiconductor Device

A semiconductor device 100 described in this embodiment includes an arithmetic logic unit ALU, a first D/A converter circuit, and an amplifier AMP (see FIGS. 1A and 1B).

Arithmetic Logic Unit ALU

The arithmetic logic unit ALU generates second data DEC[0:11] on the basis of first data DATA[0:11] and offset data COMP[0:7]. For example, the offset data COMP[0:7] is added to the first data DATA[0:11], whereby the second data DEC[0:11] can be generated. In other words, the arithmetic logic unit ALU has a function of correcting the first data DATA[0:11] into the second data DEC[0:11], using the offset data COMP[0:7]

The arithmetic logic unit ALU generates the second data DEC[0:11] on the basis of the first data DATA[0:11] and the offset data COMP[0:7].

D/A Converter Circuit

The first D/A converter circuit supplies an analog signal on the basis of the second data DEC [0:11].

The first D/A converter circuit is electrically connected to the amplifier AMP.

For example, a 12-bit D/A converter circuit can be used as the first D/A converter circuit. Specifically, a resistor-string R-string and a logic circuit PTL(1) including a pass transistor can be used for the first D/A converter circuit.

For example, the resistor-string R-string provided such that voltages of analog signals are linear with respect to the values of digital signals can be used for the first D/A converter circuit.

Thus, the first data DATA[0:11] can be corrected using addition and/or subtraction of the values of the digital signals. Operation related to the correction of the first data DATA[0:11] can be performed easily. The first data DATA [0:11] can be corrected easily using the arithmetic logic unit ALU and the offset data COMP[0:7]. The structure of the arithmetic logic unit ALU can be simplified. The area occupied by the arithmetic logic unit ALU can be made small.

Amplifier AMP

The amplifier AMP includes an operational amplifier 14, a first terminal Tm11, a second terminal Tm12, a node N3, a switch 13, and an offset adjustment circuit 20 (see FIG. 2).

The operational amplifier 14 is electrically connected to the first terminal Tm11, the second terminal Tm12, and the node N3.

The operational amplifier 14 has a function of supplying a first voltage V3 to the node N3 on the basis of a voltage between the first terminal Tm11 and the second terminal Tm12.

Switch 13

The switch 13 is electrically connected to the node N3 and the second terminal Tm12.

The switch 13 breaks the electrical connection between the node N3 and the second terminal Tm12 when an output enable signal EN is in a first state. For example, the first state of the output enable signal EN can be a low level, and the second state of the output enable signal EN can be a high level.

The switch 13 establishes the electrical connection between the node N3 and the second terminal Tm12 when the output enable signal EN is in the second state.

Structure Example 1 of Offset Adjustment Circuit 20

The offset adjustment circuit 20 is electrically connected to the node N3. The offset adjustment circuit 20 includes a level shifter 21 and a register 22.

Level Shifter 21

The level shifter 21 is electrically connected to the node N3 and the register 22.

When the output enable signal EN is in the first state, the level shifter 21 supplies a latch signal in a first state or a second state on the basis of the potential of the node N3. For example, the potential of the node N3 whose level has been shifted can be used as the latch signal in the first state or the second state. Note that the switch 13 is off when being supplied with the output enable signal EN in the first state.

When the output enable signal EN is in the second state, the level shifter 21 supplies the latch signal in the first state. In other words, the level shifter 21 supplies the latch signal in the first state regardless of the potential of the node N3 when the level shifter 21 is supplied with the output enable signal EN in the second state. Furthermore, an input terminal of the level shifter 21 is brought into a floating state. Note that the switch 13 is on when being supplied with the output enable signal EN in the second state.

Register 22

The register 22 is supplied with an offset adjustment signal F[0:7], a reset signal RESET, and the latch signal. For example, an 8-bit digital signal can be used as the offset adjustment signal.

Thus, for example, offset adjustment signals with 256 levels can be supplied. For example, 128 levels of negative values of and 128 levels of positive values can be used for the offset adjustment signal.

For example, in the case where the potential of the node N3 is made to be closer to the potential of the second terminal Tm12 such that the difference therebetween becomes less than 0.5 mV from less than 50 mV, the potential of the node N3 needs to be adjusted with approximately 200 or more levels. Specifically, the potential of the node N3 may be adjusted with eight bits, i.e., with 256 levels.

This allows the potential of the node N3 to be closer to the potential of the second terminal Tm12 such that the difference therebetween is within 0.39 mV (=100 mV÷256). Alternatively, this allows the potential of the node N3 to be sufficiently closer to the potential of the second terminal Tm12 such that the difference therebetween becomes less than 0.5 mV from less than 40 mV.

The register 22 retains, as the offset data COMP[0:7], the offset adjustment signal F[0:7] at the time when the latch signal in the second state is supplied to the register 22. For example, a plurality of latch circuits can be used in the register 22.

The register 22 allows the supplied offset adjustment signal F[0:7] to pass therethrough in a passage state and supplies the offset adjustment signal F[0:7]. Furthermore, the register 22 supplies the offset data COMP[0:7] in a non-passage state.

Thus, the offset data COMP[0:7] is added to the first data DATA[0:11], whereby the second data DEC [0:11] can be generated. When the switch 13 is off, the offset data COMP [0:7] with which the potential of the node N3 becomes closer to the potential of the second terminal Tm12 can be identified. The second data DEC [0:11] can be generated such that the potential of the node N3 is closer to the potential of the second terminal Tm12. The potential of the node N3 can be made closer to the potential of the second terminal Tm12. When the switch 13 is on, a current flowing through the node N3 can be suppressed. A bias current that flows in the semiconductor device 100 can be reduced. Power loss of the semiconductor device 100 can be reduced. Thus, a novel semiconductor device with high convenience or high reliability can be provided.

Thus, the offset adjustment signal can be supplied such that the potential of the node increases or decreases monotonously, for example. The offset adjustment signal with which the polarity of the node is reversed can be determined, for example. The offset adjustment signal with which the potential of the node becomes the closest to the potential of the second terminal can be determined. The offset adjustment signal at the time when the potential of the node is closer to the potential of the second terminal can be used as the offset data. The offset data with which the potential of the node becomes closer to the potential of the second terminal can be retained. A bias current that flows in the semiconductor device 100 can be controlled on the basis of the offset data stored in the register 22. A bias current that flows in the semiconductor device 100 electrically connected to a load can be reduced for example. Power loss of the semiconductor device 100 can be reduced. Thus, a novel semiconductor device with high convenience or high reliability can be provided.

Structure Example 2 of Semiconductor Device

In addition, the semiconductor device 100 described in this embodiment includes a selection circuit SR(1). Furthermore, the amplifier AMP includes a third terminal (see FIG. 1A and FIG. 2).

First Selection Circuit SR (1)

The selection circuit SR(1) has a function of supplying a first selection signal SEL[p]. For example, a shift register or the like can be used as the selection circuit SR(1).

Structure Example 2 of Offset Adjustment Circuit 20

The offset adjustment circuit 20 includes a tri-state buffer 23.

The tri-state buffer 23 is electrically connected to the register 22 and the third terminal Tm13.

The tri-state buffer 23 is brought into a high impedance state when the first selection signal SEL[p] is in a first state.

The tri-state buffer 23 allows the offset adjustment signal F[0:7] to pass therethrough and supplies the offset data COMP[0:7] when the first selection signal SEL[p] is in a second state.

Thus, for example, one offset adjustment circuit can be selected from a plurality of offset adjustment circuits using the first selection signal. The offset data can be supplied on the basis of the first selection signal. Thus, a novel semiconductor device with high convenience or high reliability can be provided.

Structure Example 3 of Semiconductor Device

Moreover, the semiconductor device 100 described in this embodiment includes a selection circuit SR(2) and a latch circuit LTC (see FIG. 1A and FIG. 2).

<<Selection Circuit SR(2)>>

The selection circuit SR(2) supplies a second selection signal SEL2[p]. For example, a shift register can be used as the selection circuit SR(2).

<<Latch Circuit LTC>>

The latch circuit LTC is electrically connected to the arithmetic logic unit ALU and the first D/A converter circuit.

The latch circuit LTC retains the second data DEC[0:11] when being supplied with the second selection signal SEL2 [p].

The latch circuit LTC supplies the second data DEC[0:11] in a non-passage state.

Thus, for example, one latch circuit can be selected from a plurality of latch circuits using the second selection signal. The second data can be stored in the latch circuit on the basis of the second selection signal. Thus, a novel semiconductor device with high convenience or high reliability can be provided.

Structure Example 4 of Semiconductor Device

The semiconductor device 100 described in this embodiment includes a terminal region 120 (see FIG. 1A).

The terminal region 120 includes one group of terminals 119(1) to 119(t) arranged in the row direction. The group of terminals 119(1) to 119(t) include a terminal 119(p) electrically connected to the second terminal Tm12.

With the above structure, an analog signal obtained by conversion of a digital signal into a predetermined voltage can be supplied. An analog signal into which a digital signal is converted can be supplied to one group of signal lines arranged in the row direction through the one group of terminals 119(1) to 119(t), for example. A bias current that flows through the second terminal Tm12 can be reduced. Power loss of the semiconductor device 100 can be reduced. Thus, a novel semiconductor device with high convenience or high reliability can be provided.

Structure Example 5 of Semiconductor Device

A semiconductor device 100B described in this embodiment includes a buffer amplifier BA (see FIGS. 3A and 3B).

The buffer amplifier BA includes a fourth terminal Tm21 and a fifth terminal Tm22. For example, an operational amplifier 10C can be used as the buffer amplifier BA (see FIG. 3B). Thus, an analog signal obtained by converting a digital signal to have a predetermined voltage can be supplied through the terminal.

The first D/A converter circuit has an output terminal OUT1 and an output terminal OUT2. The output terminal OUT1 and the output terminal OUT2 are electrically connected to the first terminal Tm11 and the fourth terminal Tm21, respectively.

The group of terminals 119(1) to 119(t) include a terminal 119(q) electrically connected to the terminal Tm22.

Structure Example 6 of Semiconductor Device

Figure 4A:
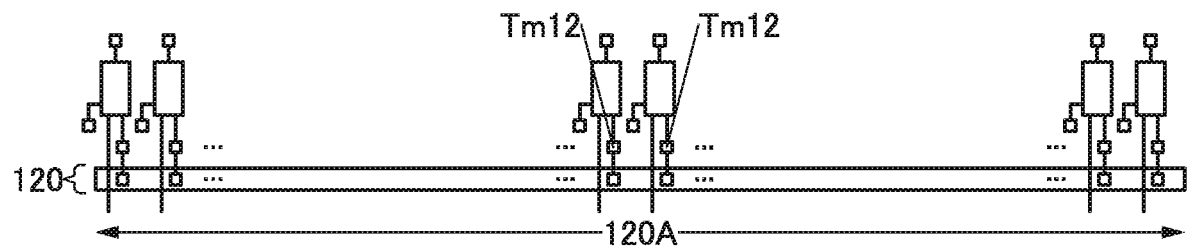
FIGS. 4A to 4E are block diagrams illustrating structures of a terminal region which can be used in a semiconductor device of an embodiment.

In the semiconductor device 100B described in this embodiment, the terminal region 120 includes one or a plurality of first regions 120A. FIG. 4A illustrates a structure with only the first region 120A, for example.

Figure 4B:
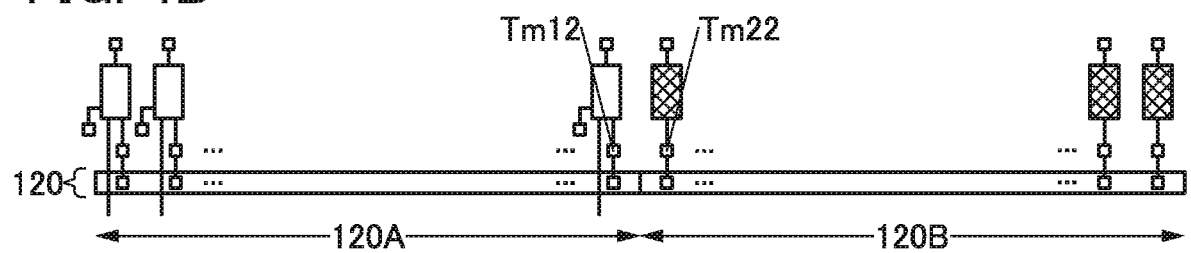
Figure 4C:
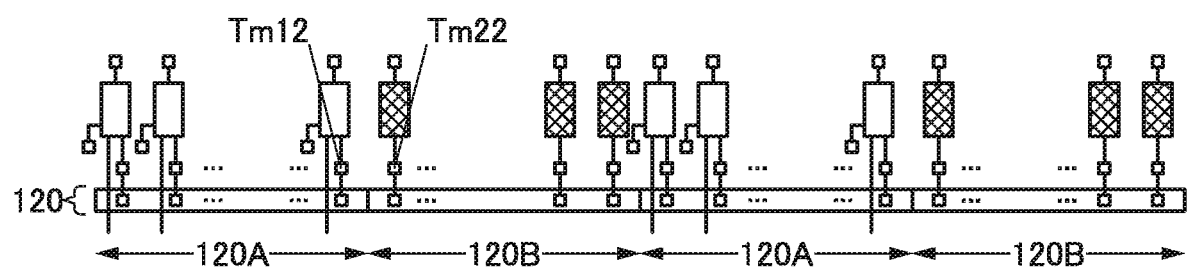
Figure 4D:
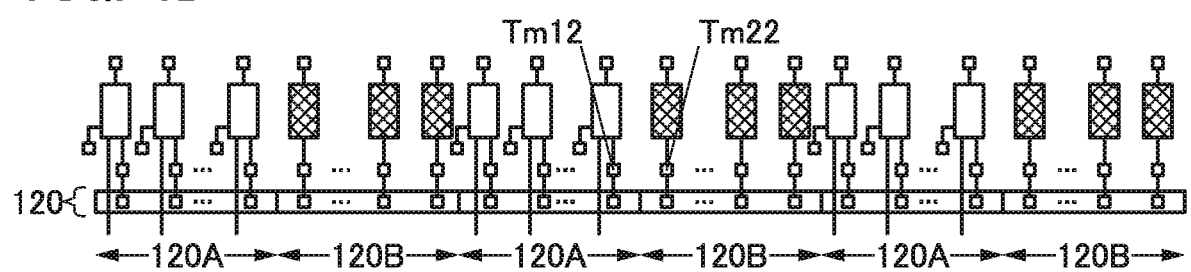

In the terminal region 120, the number of first regions 120A is equal to that of the second regions 120B (see FIGS. 4B to 4D). The first regions 120A and the second regions 120B are alternately provided in the terminal region 120. FIG. 4B illustrates a structure with one first region 120A and one second region 120B, for example. FIG. 4C illustrates a structure with two first regions 120A and two second regions 120B. FIG. 4D illustrates a structure with three first regions 120A and three second regions 120B.

Figure 4E:
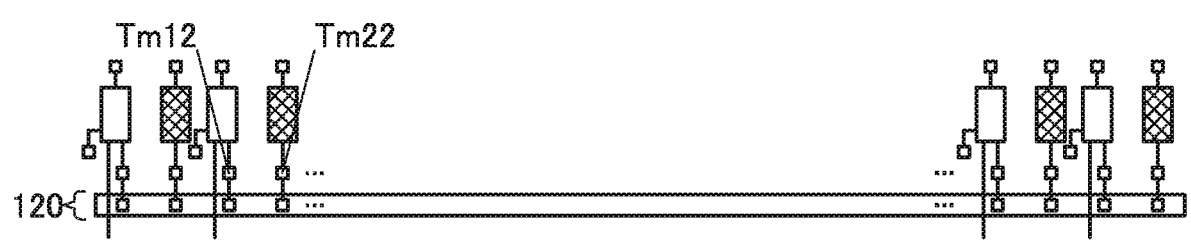

The first region 120A includes terminals electrically connected to the second terminals Tm12. The second region 120B includes terminals electrically connected to the fifth terminals Tm22. FIG. 4E illustrates a structure in which terminals electrically connected to the second terminals Tm12 and terminals electrically connected to the fifth terminals Tm22 are alternately provided, for example.

Thus, an analog signal obtained by converting a digital signal to have a predetermined voltage can be supplied to one group of signal lines arranged in the row direction through the group of terminals 119(1) to 119(t), for example. A bias current that flows through the second terminals Tm12 provided in the first region 120A can be reduced. Power loss of the semiconductor device 100B can be reduced. Consequently, a novel semiconductor device with high convenience or high reliability can be provided.

Note that this embodiment can be combined with any of the other embodiments in this specification as appropriate.

Embodiment 2

In this embodiment, the structure of a display panel of one embodiment of the present invention is described with reference to FIG. 5.

Figure 5:
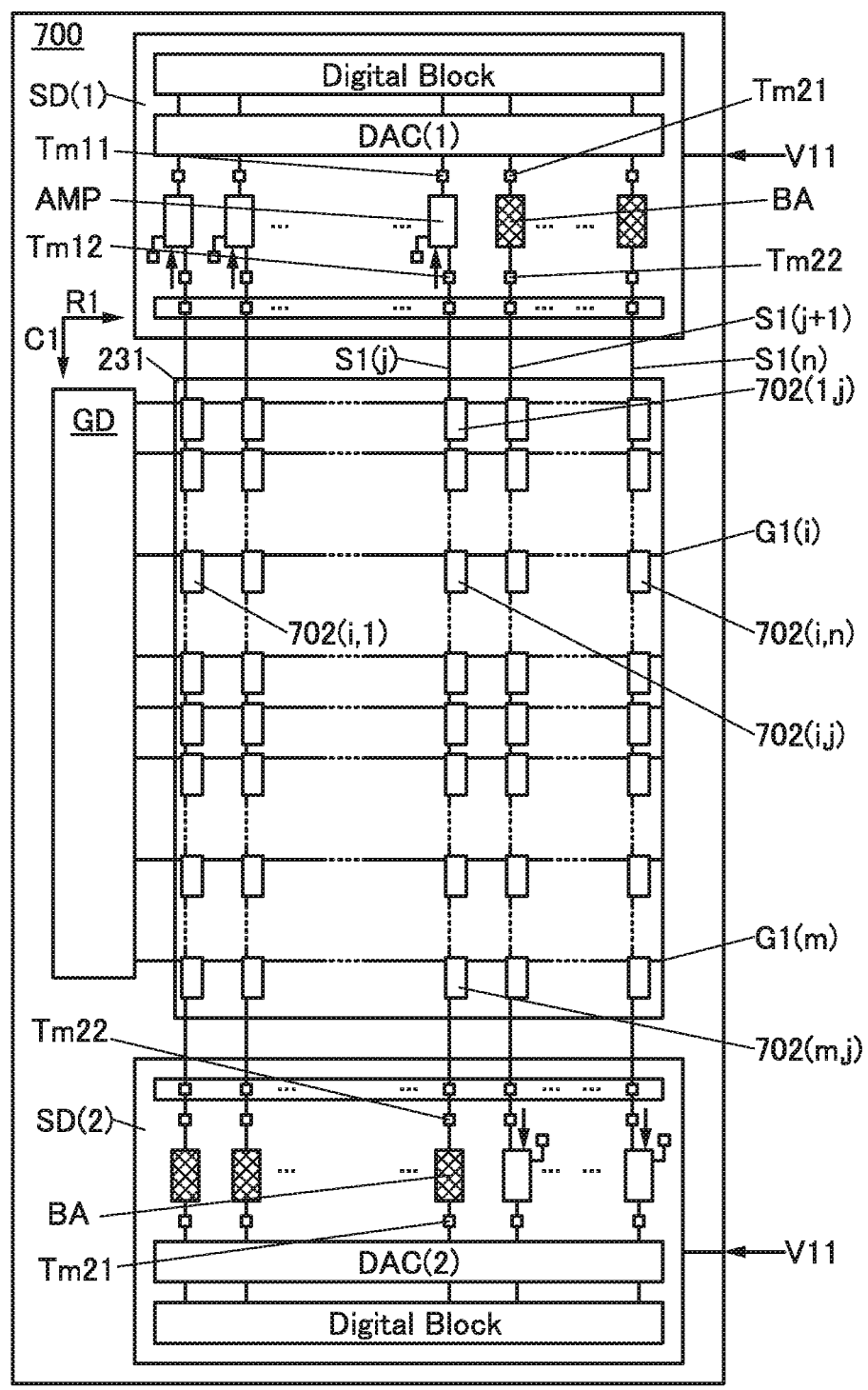
FIG. 5 is a block diagram illustrating the structure of a display panel of an embodiment.

FIG. 5 illustrates the structure of the display panel of one embodiment of the present invention.

Structure Example 1 of Display Panel

The display panel described in this embodiment includes a display region 231 and a driver circuit SD(1) (see FIG. 5). The display panel described in this embodiment also includes a driver circuit GD. The display panel includes a digital operation portion (Digital Block). The digital operation portion has a function of converting serial data into parallel data, for example. Specifically, a shift register or the like can be used for the circuit Digital Block.

<<Driver Circuit SD(1)>>

The driver circuit SD(1) has a function of supplying an image signal on the basis of the data V11.

The driver circuit SD(1) has a function of generating an image signal and a function of supplying the image signal to a pixel circuit electrically connected to a display element.

For example, any of a variety of sequential circuits, such as a shift register, can be used as the driver circuit SD(1).

For example, an integrated circuit formed on a silicon substrate can be used as the driver circuit SD(1).

An integrated circuit can be connected to a terminal by a chip on glass (COG) method or a chip on film (COF) method, for example. Specifically, an anisotropic conductive film can be used to connect an integrated circuit to a terminal.

For example, the semiconductor device 100B described in Embodiment 1 can be used for the driver circuit SD(1).

<<Driver Circuit GD>>

The driver circuit GD has a function of supplying a selection signal on the basis of control data.

The driver circuit GD has a function of supplying a selection signal to one scan line at a frequency of 30 Hz or higher, preferably 60 Hz or higher, on the basis of the control data, for example. In this case, moving images can be smoothly displayed.

The driver circuit GD has a function of supplying a selection signal to one scan line at a frequency of lower than 30 Hz, preferably lower than 1 Hz, more preferably less than once per minute, on the basis of the control data, for example. In this case, a still image can be displayed with reduced flickering.

The frame frequency can be variable. For example, display can be performed at a frame frequency of higher than or equal to 1 Hz and lower than or equal to 120 Hz. Display can be performed at a frame frequency of 120 Hz by a progressive method. Extremely high-resolution display satisfying Recommendation ITU-R BT.2020-2, which is an international standard, can be performed. Extremely high-resolution display can be performed.

Structure Example 1 of Display Region

The display region 231 includes one group of pixels 702($i$,1) to 702($i$,$n$), another group of pixels 702(1,$j$) to 702($m$,$j$), a scan line G1($i$), and a signal line S1($j$).

The group of pixels 702($i$,1) to 702($i$,$n$) are arranged in the row direction (the direction indicated by an arrow R1 in the drawing).

The group of pixels 702(1,$j$) to 702($m$,$j$) are arranged in the column direction (the direction indicated by an arrow C1 in the drawing) intersecting the row direction.

The scan line G1($i$) is electrically connected to the group of pixels 702($i$,1) to 702($i$,$n$).

The signal line S1($j$) is electrically connected to the group of pixels 702(1,$j$) to 702($m$,$j$) and the second terminal Tm12($j$).

With the above structure, an analog signal obtained by converting a digital signal to have a predetermined voltage can be supplied to one signal line. An analog signal into which a digital signal is converted can be supplied to the group of pixels 702(1,$j$) to 702($m$,$j$). A bias current that flows through the second terminal Tm12 can be reduced. Power loss of the display panel can be reduced. Thus, a novel display panel with high convenience or high reliability can be provided.

Structure Example 2 of Display Panel

The display panel described in this embodiment includes a driver circuit SD(2) (see FIG. 5). For example, the semiconductor device 100B described in Embodiment 1 can be used for the driver circuit SD(2).

<<Driver Circuit SD(2)>>

The driver circuit SD(2) includes a D/A converter circuit DAC(2) and the buffer amplifier BA.

The buffer amplifier BA has the fourth terminal Tm21 and the fifth terminal Tm22.

The fourth terminal Tm21 is electrically connected to the D/A converter circuit DAC(2).

The fifth terminal Tm22 is electrically connected to the signal line S1(j).

The signal line S1(j) includes a portion electrically connected to the group of pixels 702(1,j) to 702(m,j) between a portion electrically connected to the second terminal Tm12 and a portion electrically connected to the fifth terminal Tm22. Note that a wiring having a sufficiently large time constant is used as the signal line S1(j). Thus, even in the case where a delay of several tens of nanoseconds is caused between the operation of the driver circuit SD(1) including the second terminal Tm12 and the operation of the driver circuit SD(2) including the fifth terminal Tm22, a malfunction of overcurrent flow can be prevented.

Thus, an analog signal can be supplied from both ends of one signal line to the group of pixels 702(1,j) to 702(m,j). An influence of the parasitic resistance of one signal line on an analog signal can be reduced. An influence of the parasitic capacitance of one signal line on an analog signal can be reduced. The signal line can be charged and discharged at high speed, resisting its parasitic resistance and parasitic capacitance. Heat generated due to charge and discharge can be dispersed. A bias current that flows between the semiconductor device 100B electrically connected to one end of one signal line and the buffer amplifier BA electrically connected to the other end of the one signal line can be reduced. Power loss of the display panel can be reduced. Thus, a novel display panel with high convenience or high reliability can be provided.

Structure Example 2 of Display Region

The display region 231 includes a plurality of pixels in a matrix. For example, the display region 231 includes 7600 or more pixels in the row direction and 4300 or more pixels in the column direction. Specifically, 7680 pixels are provided in the row direction and 4320 pixels are provided in the column direction.

With the above structure, an image signal with reduced degradation can be supplied to pixels whose number is larger than that of pixels for a high definition image or a 4K image, for example. An image signal with reduced degradation can be supplied to pixels at high speed. An image with high resolution can be displayed. Display can be performed at a refresh rate of 60 Hz or higher, preferably 120 Hz or higher. Thus, a novel display panel with high convenience or high reliability can be provided.

Structure Example 3 of Display Panel

The display panel 700 described in this embodiment includes a plurality of pixels having functions of representing colors with different hues. Furthermore, colors with hues that cannot be represented by each of the plurality of pixels can be represented by additive color mixing with the use of the pixels.

Structure Example 3 of Display Region

Figure 9A:
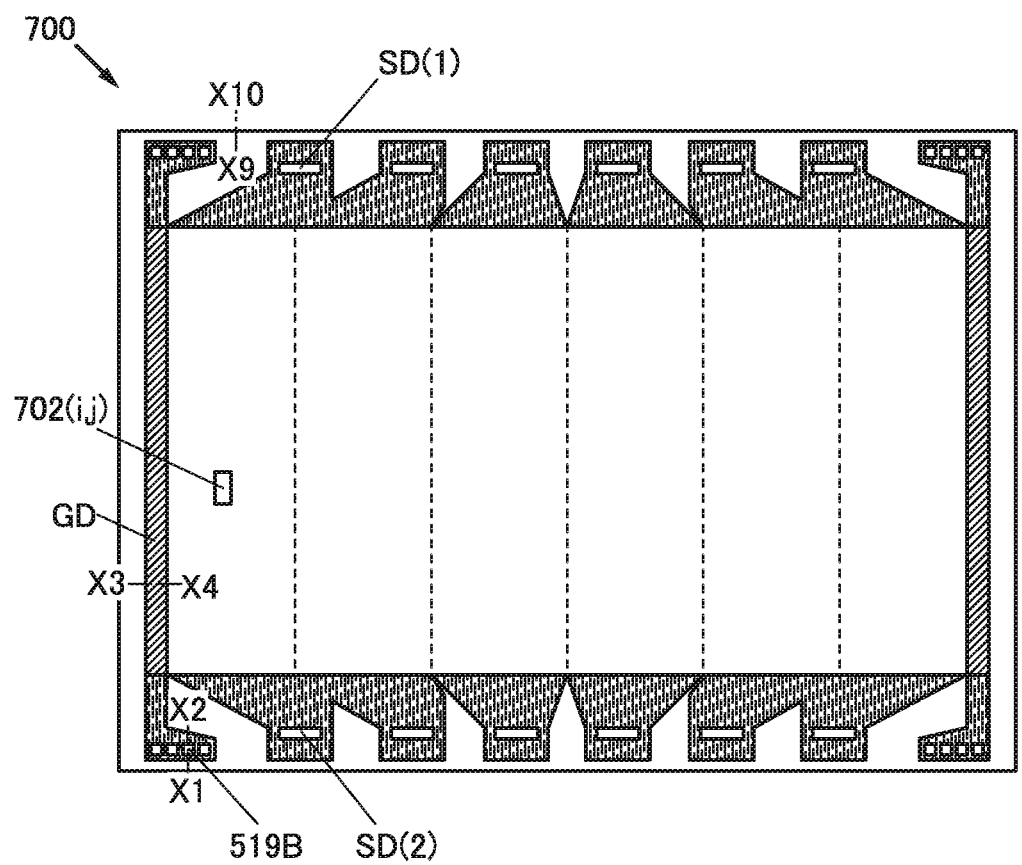
FIGS. 9A to 9C are block diagrams illustrating the structure of a display panel of an embodiment.
Figure 9B:
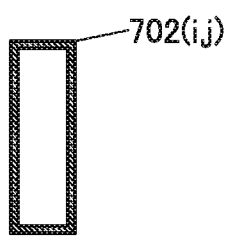
Figure 9C:
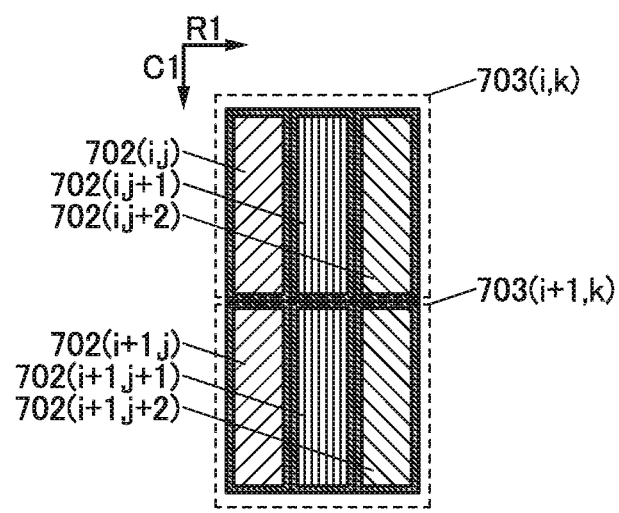

The display region 231 includes the pixel 702(i,j), the pixel 702(i,j+1), and the pixel 702(i,j+2) (see FIG. 9C).

The pixel 702(i,j) represents a color having, on the CIE 1931 chromaticity coordinates, a chromaticity x of greater than 0.680 and less than or equal to 0.720 and a chromaticity y of greater than or equal to 0.260 and less than or equal to 0.320.

The pixel 702(i,j+1) represents a color having, on the CIE 1931 chromaticity coordinates, a chromaticity x of greater than or equal to 0.130 and less than or equal to 0.250 and a chromaticity y of greater than 0.710 and less than or equal to 0.810.

The pixel 702(i,j+2) represents a color having, on the CIE 1931 chromaticity coordinates, a chromaticity x of greater than or equal to 0.120 and less than or equal to 0.170 and a chromaticity y of greater than or equal to 0.020 and less than 0.060.

Note that when a plurality of pixels capable of representing colors with different hues are used for color mixture, each of the pixels can be referred to as a subpixel. In addition, a set of subpixels can be referred to as a pixel.

For example, the pixel 702(i,j), the pixel 702(i,j+1), and the pixel 702(i,j+2) can each be referred to as a subpixel, and the pixel 702(i,j), the pixel 702(i,j+1), and the pixel 702(i,j+2) can be collectively referred to as a pixel 703(i,k) (see FIG. 9C).

Specifically, a subpixel that represents blue, a subpixel that represents green, and a subpixel that represents red can be collectively used as the pixel 703(i,k). Alternatively, a subpixel that represents cyan, a subpixel that represents magenta, and a subpixel that represents yellow can be collectively used as the pixel 703(i,k).

The above set to which, for example, a subpixel that represents white is added can be used as the pixel.

The pixel 702(i,j), the pixel 702(i,j+1), and the pixel 702(i,j+2) are provided so that the area ratio of the color gamut of the pixels 702(i,j), 702(i,j+1), and 702(i,j+2) to the BT.2020 color gamut in the CIE chromaticity coordinates (x,y) can be higher than or equal to 80%, preferably higher than or equal to 90%, or the color gamut coverage can be higher than or equal to 75%, preferably higher than or equal to 85%.

Structure Example 4 of Display Panel

Figure 6:
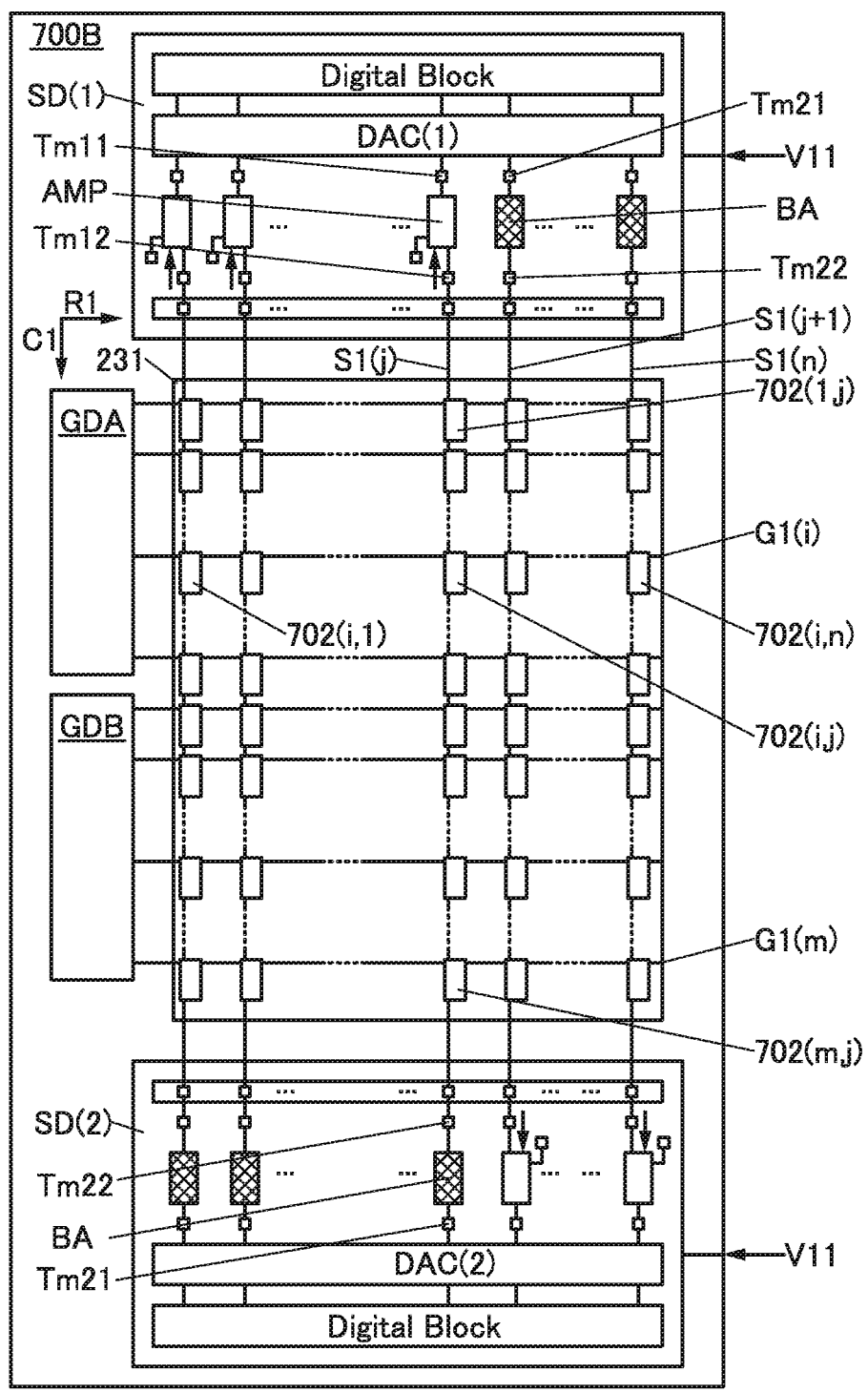
FIG. 6 is a block diagram illustrating a structure of a display panel of an embodiment.

A display panel can include a plurality of driver circuits. For example, a display panel 700B includes a driver circuit GDA and a driver circuit GDB (see FIG. 6).

For example, in the case where a plurality of driver circuits are provided, driver circuits GDA and GDB may supply selection signals at different frequencies. Specifically, the selection signal can be supplied at a higher frequency to one region on which moving images are displayed than to another region on which a still image is displayed. Accordingly, a still image can be displayed in the one region with reduced flickering, and moving images can be smoothly displayed in the other region.

<Adjustment Method of Display Panel>

An adjustment method of the display panel described in this embodiment is described with reference to FIG. 5, FIG. 7, and FIG. 8.

Figure 7:
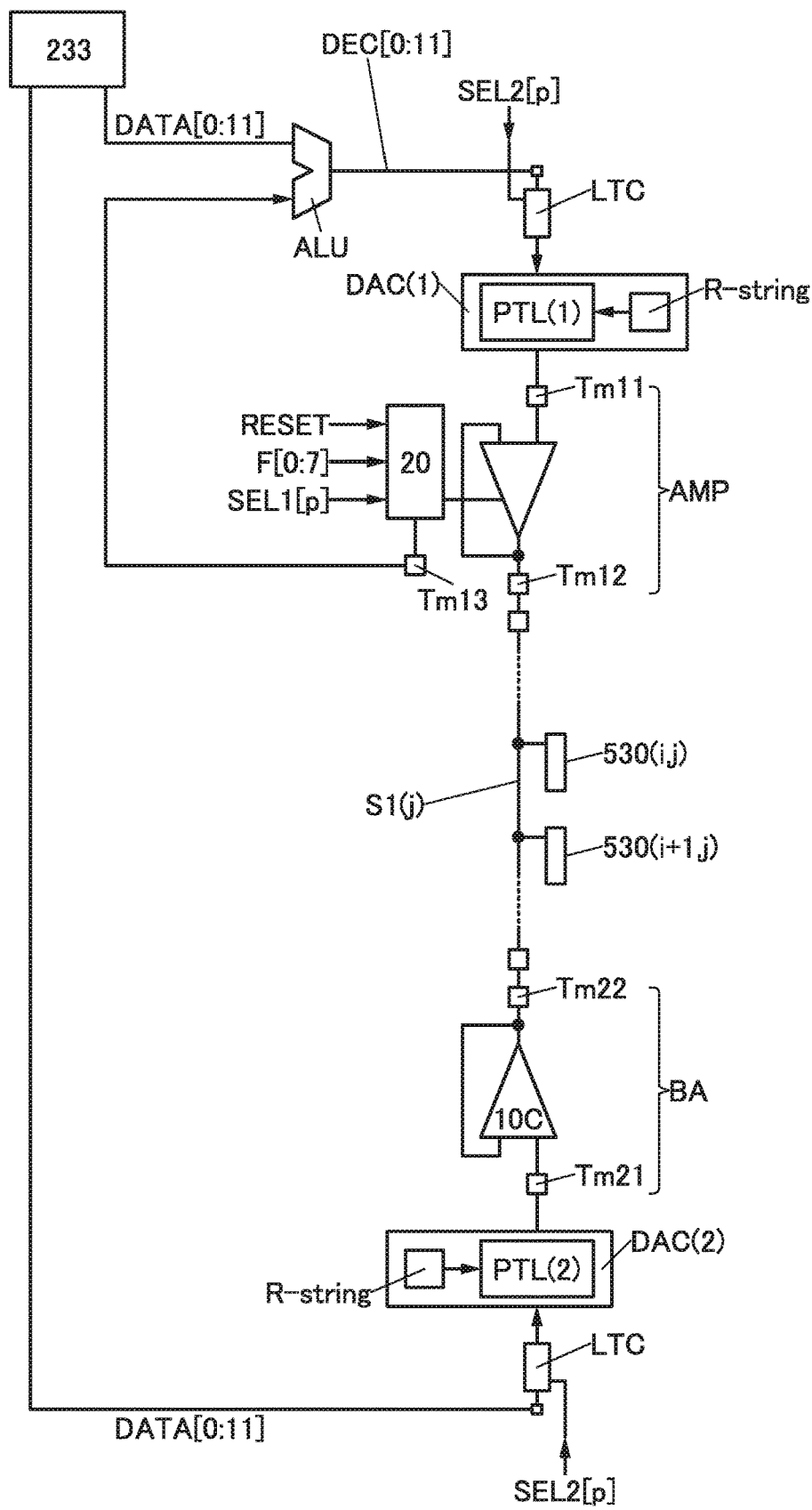
FIG. 7 is a block diagram illustrating part of the structure of a display panel of an embodiment.

FIG. 7 is a diagram illustrating part of the structure of the display panel of one embodiment of the present invention.

Figure 8:
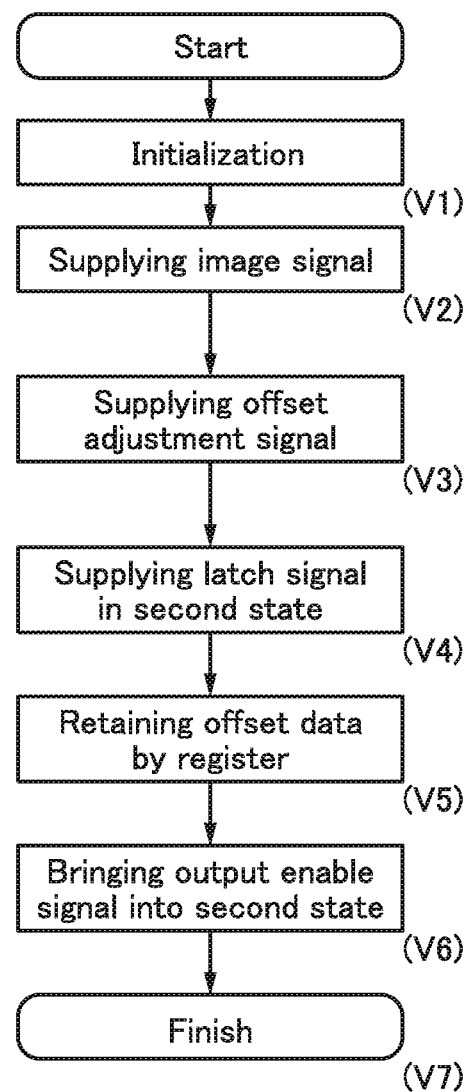
FIG. 8 is a flow chart illustrating an adjustment method of a display panel of an embodiment.

FIG. 8 is a flow chart illustrating an adjustment method of the display panel.

[First Step]

In a first step, setting is initialized (see (V1) in FIG. 8).

The output enable signal EN is brought into the first state; for example, the output enable signal EN is set to a low level. This turns off the switch 13 (see FIG. 2).

The register 22 is reset. For example, the reset signal RESET is set to a high level so that the latch circuits in the register 22 are reset. Thus, the register 22 can be brought into the passage state where the supplied offset adjustment signal F[0:7] is transmitted.

Note that the level shifter 21 supplies the latch signal in the first state or the second state on the basis of the potential of the node N3 when the level shifter 21 is supplied with the output enable signal in the first state.

[Second Step]

In a second step, the same information V11 is supplied to the driver circuit SD(1) and the driver circuit SD(2) (see (V2) in FIG. 8). For example, the first data DATA[0:11] can be used as the information V11. Specifically, given data selected from 12 bits can be used as the information V11.

A D/A converter circuit DAC(2) included in the driver circuit SD(2) supplies a predetermined potential to one of the fourth terminals Tm21 on the basis of the first data DATA[0:11] (see FIG. 5 and FIG. 7). One buffer amplifier BA included in the driver circuit SD(2) supplies a predetermined potential to the terminal Tm22, the predetermined potential is transmitted through the signal line S1(j) electrically connected to the terminal Tm22, so that the potential of one terminal Tm12 included in the driver circuit SD(1) is changed.

Note that the potential of the terminal Tm12 is changed on the basis of the first data DATA[0:11], the resistance of the signal line S1(j), and variation in the output characteristics of the buffer amplifier BA.

[Third Step]

In a third step, the offset adjustment signal F[0:7] is supplied to the offset adjustment circuit 20 (see (V3) in FIG. 8).

For example, the offset adjustment signal is supplied such that the potential of the node N3 increases monotonously from a predetermined potential of a lower limit to a predetermined potential of an upper limit (see FIG. 2 and FIG. 7). Specifically, the potential of the lower limit is set much lower than variation in the output characteristics of the buffer amplifier BA, and the potential of the upper limit is set much higher than variation in the output characteristics of the buffer amplifier BA.

For example, a digital signal that can be converted into an analog signal corresponding to a potential difference between the potential of the lower limit and the potential of the upper limit using the D/A converter circuit DAC(1) can be used as the offset adjustment signal.

For example, in the case where a digital signal that can be converted into an analog signal corresponding to a potential difference between the potential of the lower limit and the potential of the upper limit using the 12-bit D/A converter circuit as the first D/A converter circuit is an 8-bit signal, the 8-bit digital signal can be used as the offset adjustment signal F[0:7]. Specifically, a digital signal that increases monotonously from −127 to +127 can be used as the offset adjustment signal F[0:7].

The arithmetic logic unit ALU included in the driver circuit SD(1) generates the second data DEC[0:11] on the basis of the first data DATA[0:11] and the offset adjustment signal F[0:7]. For example, the second data DEC[0:11] that increases monotonously can be generated on the basis of the first data DATA[0:11] and the offset adjustment signal F[0:7] that increases monotonously.

The D/A converter circuit DAC(1) included in the driver circuit SD(1) supplies a predetermined potential to the terminal Tm11 on the basis of the second data DEC[0:11]. For example, a potential that increases monotonously from the potential of the lower limit to the potential of the upper limit is supplied to the terminal Tm11.

Thus, the arithmetic logic unit ALU can generate the second data DATA[0:11] that increases monotonously by adding the offset adjustment signal F[0:7] that increases monotonously to the first data DATA[0:11]. The first D/A converter circuit DAC(1) can supply, to the terminal Tm11, an analog signal that increases monotonously from the potential of the lower limit to the potential of the upper limit.

Note that a plurality of the second data DEC[0:11] can be generated using one arithmetic logic unit ALU on the basis of a plurality of the first data DATA[0:11] and a plurality of the offset adjustment signals F[0:7]. For example, the plurality of second data DEC[0:11] can be generated in a predetermined order on the basis of the plurality of first data DATA[0:11] supplied in a predetermined order and the plurality of offset adjustment signals F[0:7] supplied in a predetermined order.

Note that one offset adjustment circuit 20 can be selected from the plurality of offset adjustment circuits 20 in a predetermined order, and the offset adjustment signal F[0:7] can be supplied. Specifically, one offset adjustment circuit 20 can be selected using a first selection signal SEL1[p] to be synchronized with the first data DATA[0:11] (see FIGS. 1A and 1B, FIG. 2, and FIG. 7).

For example, the first selection signal SEL1[p] to be synchronized with the first data DATA[0:11] can be supplied using the first selection circuit SR(1), a clock signal CLK1 and a start pulse signal SP1 (see FIG. 7). Thus, the offset adjustment signal F[0:7] can be supplied to a predetermined offset adjustment circuit 20 in synchronization with the first data DATA[0:11].

The plurality of second data DEC[0:11] generated in a predetermined order by one arithmetic logic unit ALU can be stored in the plurality of latch circuits in a predetermined order (see FIG. 1A and FIG. 7). For example, one latch circuit is selected from the plurality of latch circuits using the second selection signal SEL2[p] to be synchronized with the second data DEC[0:11], and the second data DEC[0:11] can be stored.

For example, the second selection signal SEL2[p] to be synchronized with the second data DEC[0:11] can be supplied using the second selection circuit SR(2), a clock signal CLK2, and a start pulse signal SP2 (see FIG. 7). Thus, the second data DEC[0:11] can be stored in a predetermined latch circuit LTC.

Accordingly, the plurality of second data can be generated using one arithmetic logic unit ALU on the basis of the plurality of first data and the plurality of offset adjustment signals. The plurality of second data generated by one arithmetic logic unit ALU can be distributed to the plurality of latch circuits. The second data can be stored in the latch circuit.

[Fourth Step]

In a fourth step, the potential of the node N3 is changed from a negative potential to a positive potential, and the level shifter 21 supplies the latch signal in the second state (see (V4) in FIG. 8). For example, the level shifter 21 supplies the latch signal in the second state when the potential of the terminal Tm11, which increases monotonously from the potential of the lower limit to the potential of the upper limit, is higher than that of the terminal Tm12. Note that in this specification, the offset adjustment signal F[0:7] at the time when the latch signal in the second state is supplied is referred to as the offset data COMP[0:7].

Thus, an offset adjustment signal [0:7] with which the potential of the terminal Tm11 is made closer to the potential of the terminal Tm12 can be identified. In other words, an offset data COMP[0:7] that corrects the first data [0:11] such that variation in the output characteristics of the buffer amplifier BA is canceled can be identified.

[Fifth Step]

In a fifth step, the register 22 supplied with the latch signal in the second state retains the offset data COMP[0:7] (see (V5) in FIG. 8).

Thus, the offset data COMP[0:7] can be stored in the register 22. The register 22 can supply the offset data COMP[0:7] through the tri-state buffer 23 at the time when the first selection signal SEL[p] is in the second state.

[Sixth Step]

In a sixth step, the output enable signal EN is brought into the second state (see (V6) in FIG. 8); for example, the output enable signal EN is set to a high level. This turns on the switch 13.

Note that the level shifter 21 supplies the latch signal in the first state when the level shifter 21 is supplied with the output enable signal in the second state.

[Seventh Step]

In a seventh step, adjustment of the display panel is completed (see (V7) in FIG. 8).

The semiconductor device 100 of one embodiment of the present invention can include a nonvolatile memory portion. The nonvolatile memory portion can retain offset data, for example. The semiconductor device 100 may read the offset data retained in the memory portion and write the offset data to the register 22. In that case, the frequency of adjustment of the display panel can be reduced. For example, the display panel may be adjusted in shipment of the display panel.

By the above adjustment method of the display panel, offset data with which a bias current that flows through the signal line is reduced can be identified. The offset data can be stored in the register. A bias current that flows through the signal line can be reduced. Power loss of the display panel can be reduced.

Although adjusting the output of the buffer amplifier by referring to the reference potential VREF is known, for example, variations in output characteristics of the buffer amplifier cannot be eliminated.

In the case where the output characteristics of the buffer amplifier vary from −40 mV to +40 mV, for example, a potential difference between the buffer amplifiers connected to both ends of one signal line is 80 mV at the most.

For example, in the case of a display device with a size of about 50 inches, the resistance of one signal line is several kilo-ohms. In the case where the resistance of one signal line is 5 kΩ, a bias current is up to 16 μA, or up to 8 μA even when a potential difference is assumed to be 40 mV.

For example, in the case where the number of pixels is 7680, the number of signal lines connected to subpixels is 7680×3, and the total bias current is 183.12 mA (=8 μA×7680×3). When the power supply voltage of the buffer amplifier is 16V, power loss due to the bias current is as high as 2.92992 W (=16 V×183.12 mA).

The semiconductor device of one embodiment of the present invention can reduce a bias current that flows in the display panel. Furthermore, the power loss of a display device can be reduced.

Structure Example 5 of Display Panel

The structure of the display panel 700 described in this embodiment is described with reference to FIGS. 9A to 9C, FIGS. 10A and 10B, and FIGS. 11A and 11B.

FIG. 9A is a top view illustrating the structure of the display panel of one embodiment of the present invention. FIG. 9B is a top view illustrating part of FIG. 9A. FIG. 9C is a top view illustrating another part of FIG. 9A.

Figure 10A:
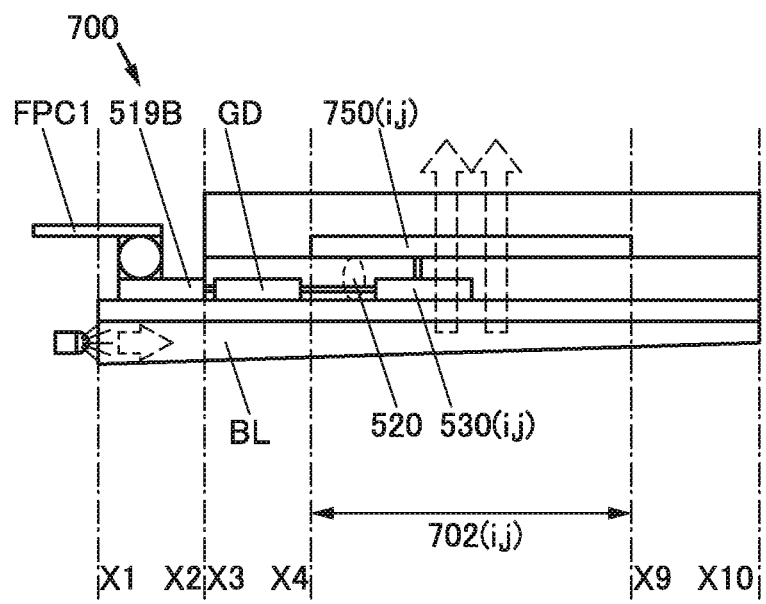
FIGS. 10A and 10B are a cross-sectional view and a circuit diagram illustrating the structure of a display panel of an embodiment.
Figure 10B:
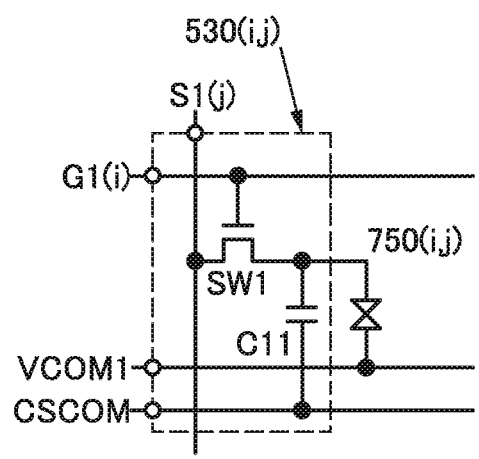

FIG. 10A is a cross-sectional view taken along line X1-X2, line X3-X4, and line X9-X10 in FIG. 9A. FIG. 10B is a circuit diagram illustrating a pixel circuit.

Figure 11A:
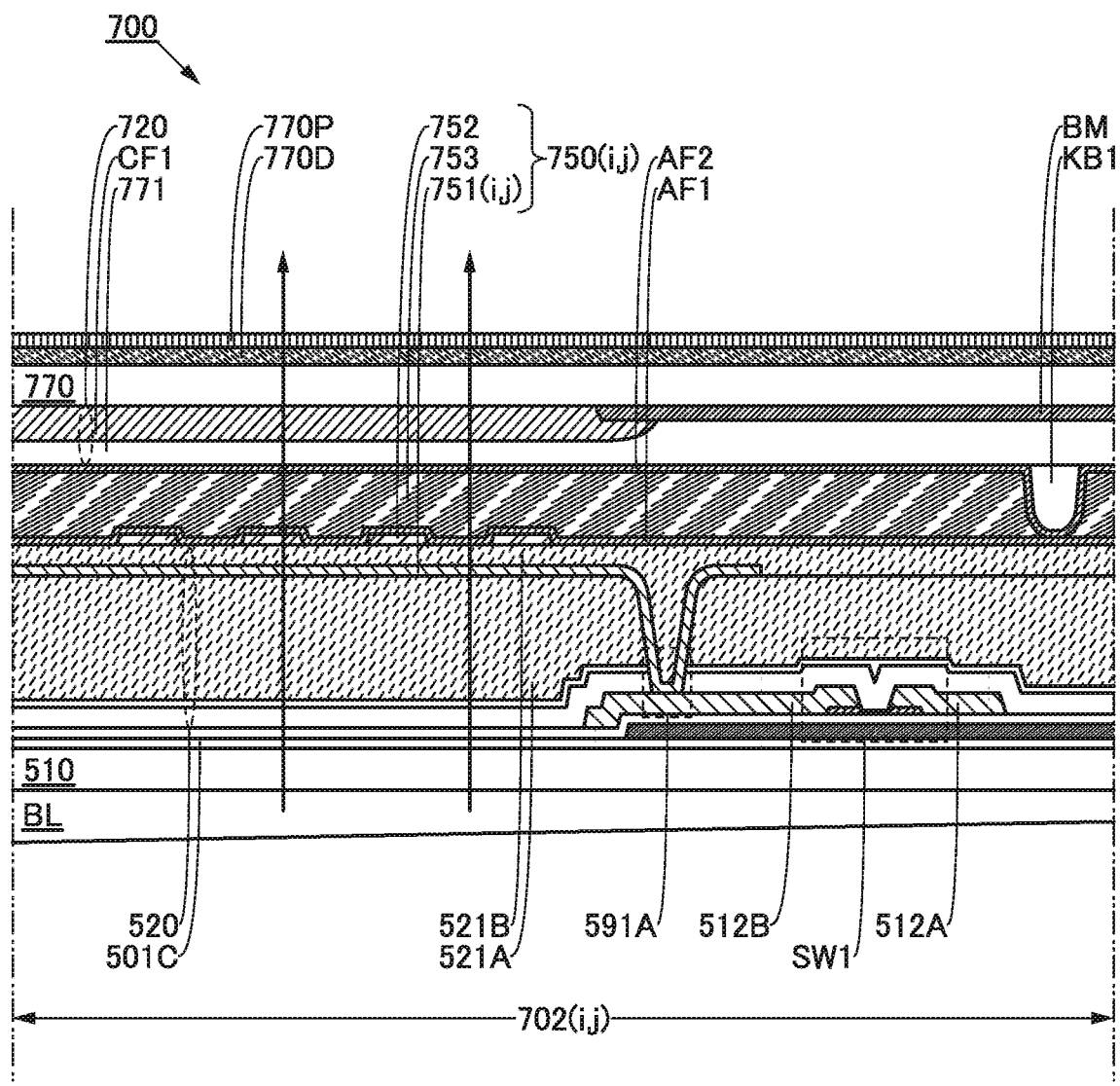
FIGS. 11A and 11B are cross-sectional views illustrating the structure of a pixel in a display panel of an embodiment.
Figure 11B:
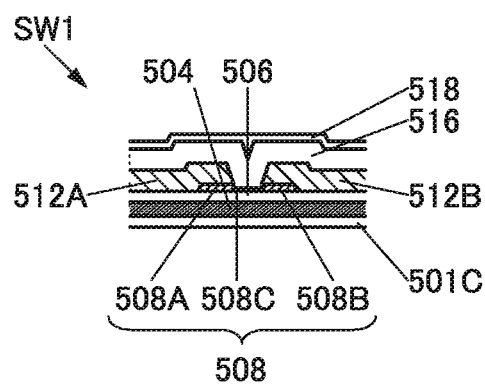

FIGS. 11A and 11B are cross-sectional views illustrating the structure of the display panel of one embodiment of the present invention. FIG. 11A is a cross-sectional view illustrating the structure of the pixels. FIG. 11B is a cross-sectional view illustrating part of FIG. 11A.

The display panel 700 includes the driver circuit SD(1), the driver circuit SD(2), the driver circuit GD, and a terminal 519B (see FIG. 9A).

The display panel 700 includes a substrate 510, a substrate 770, a functional layer 520, and an insulating film 501C (see FIG. 11A). Furthermore, the display panel 700 includes a functional layer 720, a functional film 770P, and a functional film 770D.

The insulating film 501C includes a region between the substrate 510 and the substrate 770. The functional layer 520 includes a region between the insulating film 501C and the substrate 770.

Structure Example 1 of Pixel

The pixel 702(i,j) includes the functional layer 520 and a display element 750(i,j) (see FIG. 10A).

Structure Example 1 of Functional Layer 520

The functional layer 520 includes a pixel circuit 530(i,j), an insulating film 521A, and an insulating film 521B (see FIG. 10A and FIG. 11A).

Structure Example 1 of Pixel Circuit 530(i,j)

For example, a switch, a transistor, a diode, a resistor, an inductor, a capacitor, or the like can be included in the pixel circuit 530(i,j).

The pixel circuit 530(i,j) has a function of driving the display element 750(i,j). A liquid crystal display element can be driven using the pixel circuit illustrated in FIG. 10B, for example.

The pixel circuit 530(i,j) includes a switch SW1 and a capacitor C11.

For example, a transistor can be used as the switch SW1 (see FIG. 10B and FIGS. 11A and 11B).

<<Transistor>>

The transistor includes a semiconductor film 508, a conductive film 504, a conductive film 512A, and a conductive film 512B (see FIG. 11B).

The semiconductor film 508 includes a region 508A electrically connected to the conductive film 512A and a region 508B electrically connected to the conductive film 512B.

The semiconductor film 508 includes a region 508C overlapping with the conductive film 504, between the region 508A and the region 508B.

The conductive film 504 functions as a gate electrode.

The insulating film 506 includes a region between the semiconductor film 508 and the conductive film 504. The insulating film 506 functions as a gate insulating film.

The conductive film 512A has one of a function of a source electrode and a function of a drain electrode, and the conductive film 512B has the other.

Note that, for example, a semiconductor film formed in one process can be used for transistors in the driver circuit and the pixel circuit.

As the transistor in the driver circuit and/or the pixel circuit, a bottom-gate transistor or a top-gate transistor can be used, for example.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. A film containing copper includes a region located such that a film containing tantalum and nitrogen is positioned between the film containing copper and the insulating film 506.

For example, a stacked-layer film in which a 400-nm-thick film containing silicon and nitrogen and a 200-nm-thick film containing silicon, oxygen, and nitrogen are stacked can be used as the insulating film 506. Note that the film containing silicon and nitrogen includes a region located such that the film containing silicon, oxygen, and nitrogen is positioned between the film containing silicon and nitrogen and the semiconductor film 508.

For example, a conductive film in which a 50-nm-thick film containing tungsten, a 400-nm-thick film containing aluminum, and a 100-nm-thick film containing titanium are stacked in this order can be used as the conductive films 512A and 512B. Note that the film containing tungsten includes a region in contact with the semiconductor film 508.

A manufacturing line for a bottom-gate transistor using amorphous silicon as a semiconductor can be easily remodeled into a manufacturing line for a bottom-gate transistor using an oxide semiconductor as a semiconductor, for example. Furthermore, for example, a manufacturing line for a top-gate transistor using polysilicon as a semiconductor can be easily remodeled into a manufacturing line for a top-gate transistor using an oxide semiconductor as a semiconductor. In any reconstruction, a conventional manufacturing line can be effectively used.

<<Semiconductor Film>>

For example, a transistor using, as the semiconductor film, a semiconductor containing an element belonging to Group 14 can be used. Specifically, a semiconductor containing silicon can be used for the semiconductor film. For example, single crystal silicon, polysilicon, microcrystalline silicon, or amorphous silicon can be used for the semiconductor film of the transistor.

Note that the temperature for forming a transistor using polysilicon as a semiconductor is lower than the temperature for forming a transistor using single crystal silicon as a semiconductor.

In addition, the transistor using polysilicon as a semiconductor has higher field-effect mobility than a transistor using amorphous silicon as a semiconductor, and therefore, a pixel including the transistor using polysilicon can have a high aperture ratio. Moreover, pixels arranged at high density, a gate driver circuit, and a source driver circuit can be formed over the same substrate. As a result, the number of components included in an electronic device can be reduced.

A transistor using polysilicon as a semiconductor has higher reliability than a transistor using amorphous silicon as a semiconductor.

Alternatively, a transistor including a compound semiconductor can be used. Specifically, a semiconductor containing gallium arsenide can be used for the semiconductor film.

Alternatively, a transistor including an organic semiconductor can be used. Specifically, an organic semiconductor containing any of polyacenes and graphene can be used for the semiconductor film.

For example, a transistor using an oxide semiconductor for a semiconductor film can be used. Specifically, an oxide semiconductor containing indium or an oxide semiconductor containing indium, gallium, and zinc can be used for the semiconductor film.

For example, a transistor having a lower leakage current in an off state than a transistor using amorphous silicon for a semiconductor film can be used. Specifically, a transistor using an oxide semiconductor as a semiconductor film can be used.

Thus, a pixel circuit can hold an image signal for a longer time than a pixel circuit including a transistor using amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the data processing device can be reduced, and power consumption for driving can be reduced.

Structure Example of Display Element 750$(i,j)$

For example, a display element having a function of controlling transmission or reflection of light can be used as the display element 750$(i,j)$. Specifically, a combined structure of a liquid crystal element and a polarizing plate, a MEMS shutter display element, a MEMS optical coherence display element, or the like can be used.

For example, a reflective liquid crystal display element or a display element using a microcapsule method, an electrophoretic method, an electrowetting method, or the like can be used as the display element 750$(i,j)$. The use of a reflective display element can reduce the power consumption of the display panel.

The display element 750$(i,j)$ includes a region overlapping with the functional layer 520 (see FIG. 10A and FIG. 11A). In addition, the display element 750$(i,j)$ is electrically connected to the pixel circuit 530$(i,j)$. For example, a transmissive liquid crystal display element can be used as the display element 750$(i,j)$. The display panel 700 has a function of controlling transmission of light from a backlight BL to display an image.

For example, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The display element 750$(i,j)$ includes a first electrode 751$(i,j)$, a second electrode 752, and a layer 753 containing a liquid crystal material.

The first electrode 751$(i,j)$ is electrically connected to the pixel circuit 530$(i,j)$ at a connection portion 591A.

The second electrode 752 is provided such that an electric field that controls the alignment of the liquid crystal material is formed between the second electrode 752 and the first electrode 751(i,j).

The display element 750(i,j) includes an alignment film AF1 and an alignment film AF2.

The layer 753 containing a liquid crystal material includes a region between the alignment film AF1 and the alignment film AF2.

For example, a liquid crystal material having a resistivity of greater than or equal to $1.0 \times 10^{13}$ Ω·cm, preferably greater than or equal to $1.0 \times 10^{14}$ Ω·cm, more preferably greater than or equal to $1.0 \times 10^{15}$ Ω·cm, can be used for the layer 753 containing a liquid crystal material. This can suppress a variation in the transmittance of the display element 750(i,j). Flickering of the display element 750(i,j) can be suppressed. The rewriting frequency of the display element 750(i,j) can be reduced.

<<Structure Body KB1>>

The structure body KB1 has a function of providing a certain space between the functional layer 520 and the substrate 770.

<<Functional Layer 720>>

The functional layer 720 includes a coloring film CF1, an insulating film 771, and a light-blocking film BM.

The coloring film CF1 includes a region between the substrate 770 and the display element 750(i,j).

The light-blocking film BM has an opening in a region overlapping with the pixel 702(i,j).

The insulating film 771 includes a region between the coloring film CF1 and the layer 753 containing a liquid crystal material and a region between the light-blocking film BM and the layer 753 containing a liquid crystal material. Thus, unevenness due to the thickness of the coloring film CF1 can be reduced. The insulating film 771 can prevent impurities from diffusing from the light-blocking film BM, the coloring film CF1, and the like to the layer 753 containing a liquid crystal material.

<<Functional Film 770P, Functional Film 770D, and the Like>>

The functional film 770P includes a region overlapping with the display element 750(i,j). The functional film 770D also includes a region overlapping with the display element 750(i,j).

An anti-reflection film, a polarizing film, a retardation film, a light diffusion film, a condensing film, or the like can be used for the functional film 770P or the functional film 770D, for example.

Specifically, a circularly polarizing film can be used for the functional film 770P. Furthermore, a light diffusion film can be used for the functional film 770D.

Furthermore, an antistatic film preventing the attachment of a foreign substance, a water repellent film preventing stains, an antireflection film, an anti-glare (non-glare) film, a hard coat film suppressing a scratch in use, or the like can be used as the functional film 770P.

Structure Example 6 of Display Panel

The structure of the display panel 700 described in this embodiment is described with reference to FIGS. 9A to 9C, FIGS. 12A and 12B, and FIGS. 13A and 13B.

FIG. 9A is a top view illustrating the structure of the display panel of one embodiment of the present invention. FIG. 9B is a top view illustrating part of FIG. 9A. FIG. 9C is a top view illustrating the other part.

Figure 12A:
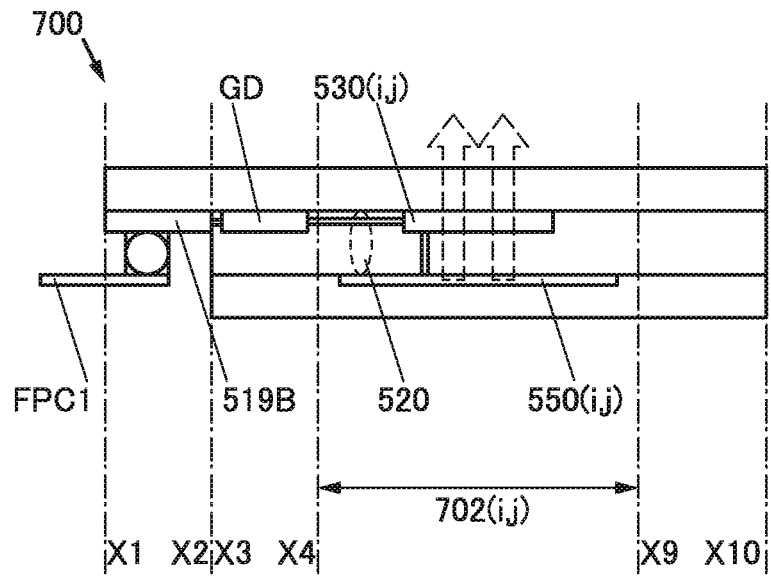
FIGS. 12A and 12B are a cross-sectional view and a circuit diagram illustrating the structure of a display panel of an embodiment.
Figure 12B:
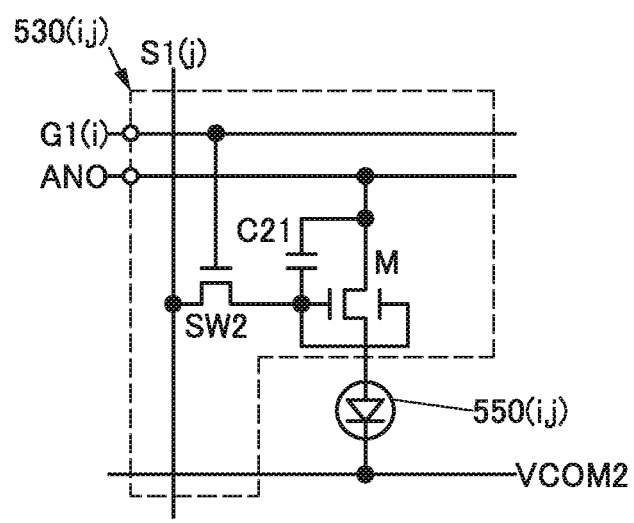

FIG. 12A is a cross-sectional view taken along line X1-X2, line X3-X4, and line X9-X10 in FIG. 9A. FIG. 12B is a circuit diagram illustrating a pixel circuit.

Figure 13A:
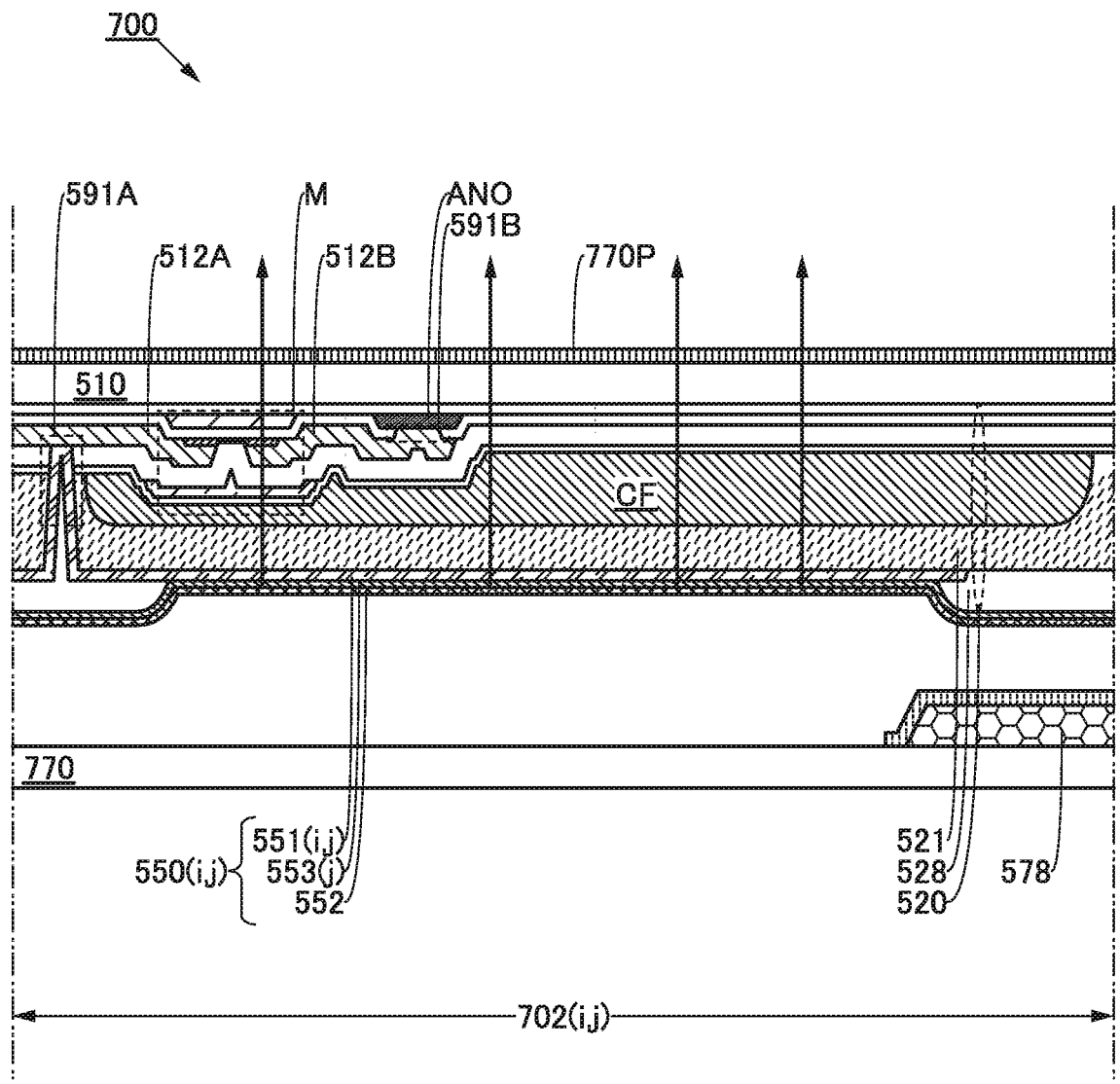
FIGS. 13A and 13B are cross-sectional views illustrating the structure of a pixel in a display panel of an embodiment.
Figure 13B:
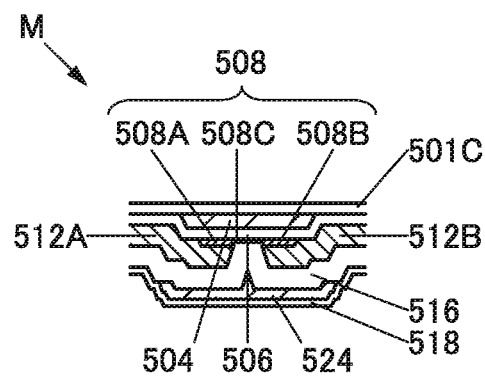

FIGS. 13A and 13B are cross-sectional views illustrating the structure of the display panel of one embodiment of the present invention. FIG. 13A is a cross-sectional view illustrating the structure of a pixel. FIG. 13B is a cross-sectional view illustrating part of FIG. 13A.

The display panel 700 includes the substrate 510, the substrate 770, the functional layer 520, and the insulating film 501C (see FIG. 13A). In addition, the display panel 700 can include the functional film 770P.

The insulating film 501C includes a region between the substrate 510 and the substrate 770. The functional layer 520 includes a region between the insulating film 501C and the substrate 770.

Structure Example 2 of Pixel

The pixel 702(i,j) includes the functional layer 520 and a display element 550(i,j) (see FIG. 12A).

Structure Example 2 of Functional Layer 520

The functional layer 520 includes the pixel circuit 530(i,j), an insulating film 521, an insulating film 528, and the coloring film CF1 (see FIG. 12A and FIG. 13A).

Structure Example 2 of Pixel Circuit 530(i,j)

An organic electroluminescent (EL) element can be driven with the pixel circuit illustrated in FIG. 12B, for example. Specifically, the display element 550(i,j) can be driven with a transistor M.

<<Transistor>>

The transistor includes the semiconductor film 508, the conductive film 504, the conductive film 512A, and the conductive film 512B.

The transistor including a conductive film 524 can also be used in the pixel circuit 530(i,j) (see FIG. 13B).

The semiconductor film 508 is sandwiched between the conductive film 504 and a region included in the conductive film 524. The insulating film 516 includes a region between the conductive film 524 and the semiconductor film 508. For example, the conductive film 524 can be electrically connected to a wiring supplying the same potential as that supplied to the conductive film 504.

Structure Example of Display Element 550(i,j)

A display element having a function of emitting light can be used as the display element 550(i,j), for example (see FIG. 12A). Specifically, an organic electroluminescent element, an inorganic electroluminescent element, a light-emitting diode, a quantum-dot LED (QDLED), or the like can be used as the display element 550(i,j).

For example, quantum dots can be used for the display element 550(i,j). Accordingly, bright-color light with a narrow half width can be emitted.

The display element 550(i,j) includes a region overlapping with the functional layer 520 (see FIG. 12A and FIG. 13A). The display element 550(i,j) is electrically connected to the pixel circuit 530(i,j). For example, an organic electroluminescent element can be used for the display element 550(i,j).

The display element 550(i,j) includes a first electrode 551(i,j), a second electrode 552, and a layer 553(j) containing a light-emitting material.

The first electrode 551(i,j) is electrically connected to the pixel circuit 530(i,j) at the connection portion 591A. The pixel circuit 530(i,j) is electrically connected to a wiring ANO at a connection portion 591B.

For example, a layered material for emitting blue light, green light, or red light can be used for the layer 553(j) containing a light-emitting material.

For example, a belt-like layered material that extends in the column direction along the signal line S1(j) can be used for the layer 553(j) containing a light-emitting material.

For example, a layered material for emitting white light can be used for the display element 550(i,j). Specifically, a layered material in which a layer containing a light-emitting material including a fluorescent material that emits blue light, and a layer containing materials that are other than a fluorescent material and that emits green light and red light or a layer containing a material that is other than a fluorescent material and that emits yellow light are stacked can be used for the display element 550(i,j).

<<Drying Agent 578>>

A drying agent 578 includes a region between the display element 550(i,j) and the substrate 770.

Note that this embodiment can be combined with any of the other embodiments in this specification as appropriate.

Embodiment 3

In this embodiment, structures of a display device of one embodiment of the present invention are described with reference to FIGS. 14A, 14B1, 14B2, and 14B3.

Figure 14A:
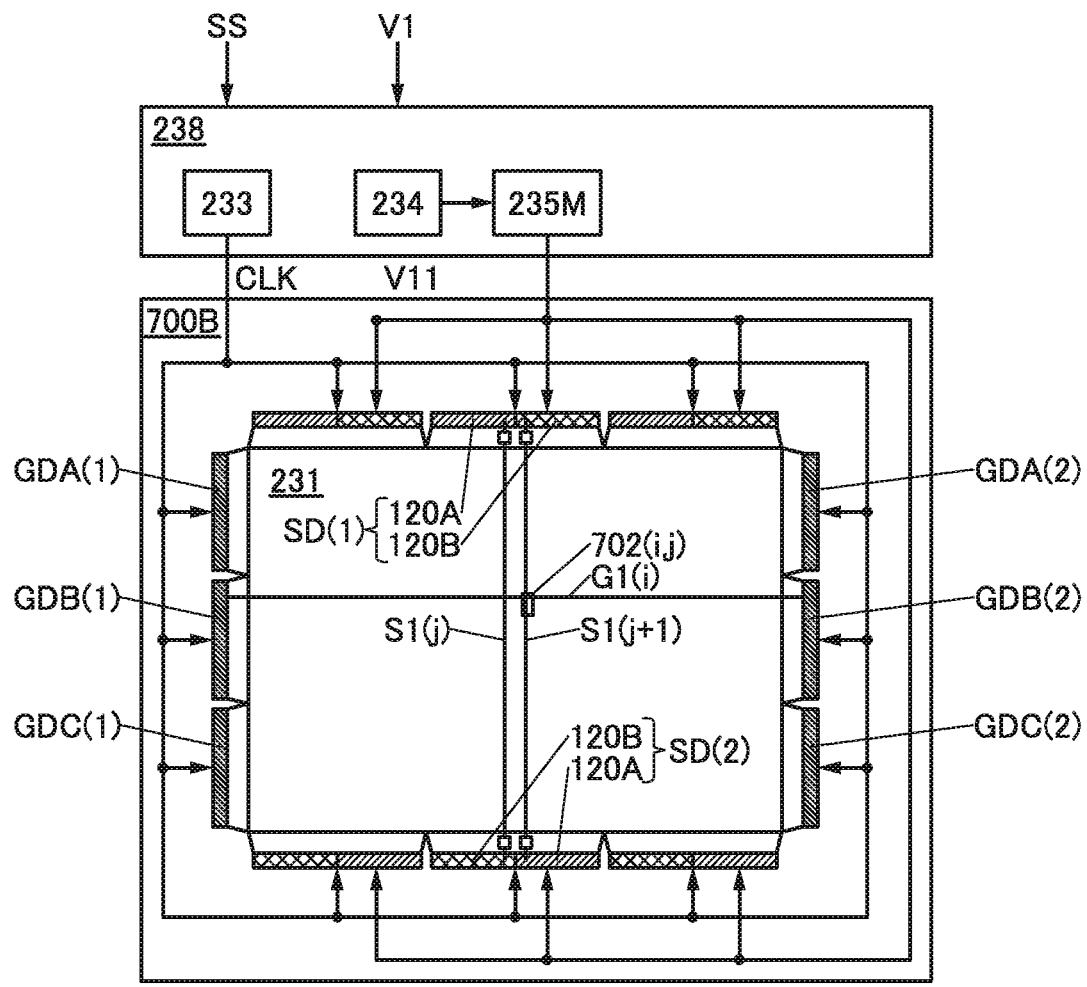
Figures 1, 14B:
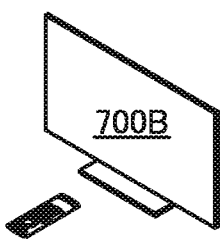
Figures 2, 14B:
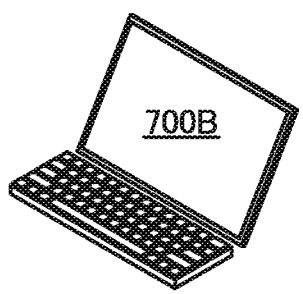
Figures 3, 14B:
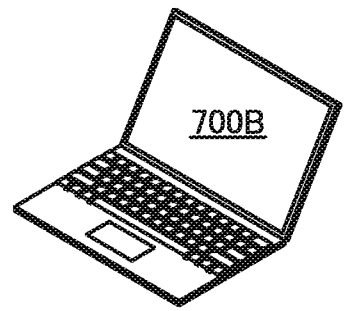

FIGS. 14A, 14B1, 14B2, and 14B3 illustrate structures of a display device of one embodiment of the present invention. FIG. 14A is a block diagram of a display device of one embodiment of the present invention. FIGS. 14B1, 14B2, and 14B3 are perspective views illustrating structures of the display device of one embodiment of the present invention.

Structure Example of Display Device

The display device described in this embodiment includes a control portion 238 and the display panel 700B (see FIG. 14A).

<<Control Portion 238>>

The control portion 238 has a function of receiving image data V1 and control data SS.

The control portion 238 has a function of generating data V11 on the basis of the image data V1. The control portion 238 has a function of supplying the data V11. The data V11 contains a gray scale of 12 bits or more, for example.

The control portion 238 includes a timing controller 233, a decompression circuit 234, and an image processing circuit 235M, for example.

<<Timing Controller 233>>

The timing controller 233 has a function of supplying control data SS to a driver circuit GDA(1), a driver circuit GDB(1), a driver circuit GDC(1), a driver circuit GDA(2), a driver circuit GDB(2), a driver circuit GDC(2), the driver circuit SD(1), the driver circuit SD(2), and the like. Thus, a plurality of driver circuits can be driven in synchronization with each other.

Note that the timing controller 233 can be included in the display panel. For example, the timing controller 233 that is mounted on a rigid substrate and is electrically connected to driver circuits with the use of a flexible printed circuit can be used in the display panel.

<<Display Panel 700B>>

The display panel 700B has a function of receiving the data V11. Further, the display panel 700B includes the pixel 702(i,j). For example, the scan line G1(i) is supplied with a selection signal at a frequency of greater than or equal to 60 Hz, preferably greater than or equal to 120 Hz. For example, the driver circuits GDA(1) to GDC(1) and the driver circuits GDA(2) to GDC(2) each have a function of supplying a selection signal.

The pixel 702(i,j) includes the display element 750(i,j) (see FIG. 10A).

The display element 750(i,j) has a function of displaying an image on the basis of the data V11. For example, a liquid crystal element can be used as the display element 750(i,j).

For example, the display panel described in Embodiment 2 can be used as the display panel 700B.

With such a structure, image data can be displayed using the display element. Consequently, a novel display device with high convenience or high reliability can be provided.

For example, a television receiver system (see FIG. 14B1), a video monitor (see FIG. 14B2), a laptop computer (see FIG. 14B3), or the like can be provided.

<<Decompression Circuit 234>>

The decompression circuit 234 has a function of decompressing the image data V1 supplied in a compressed state. The decompression circuit 234 includes a memory portion. The memory portion has a function of storing decompressed image data, for example.

<<Image Processing Circuit 235M>>

The image processing circuit 235M includes a region, for example.

The region has a function of storing data contained in the image data V1, for example.

The image processing circuit 235M has a function of generating the data V11 by correcting the image data V1 on the basis of a predetermined characteristics curve and a function of supplying the data V11, for example. Specifically, the image processing circuit 235M has a function of generating the data V11 so that the display element 550(i,j) can display a favorable image.

Note that this embodiment can be combined with any of the other embodiments in this specification as appropriate.

Embodiment 4

In this embodiment, the structure of an input/output device of one embodiment of the present invention is described with reference to FIG. 15.

Figure 15:
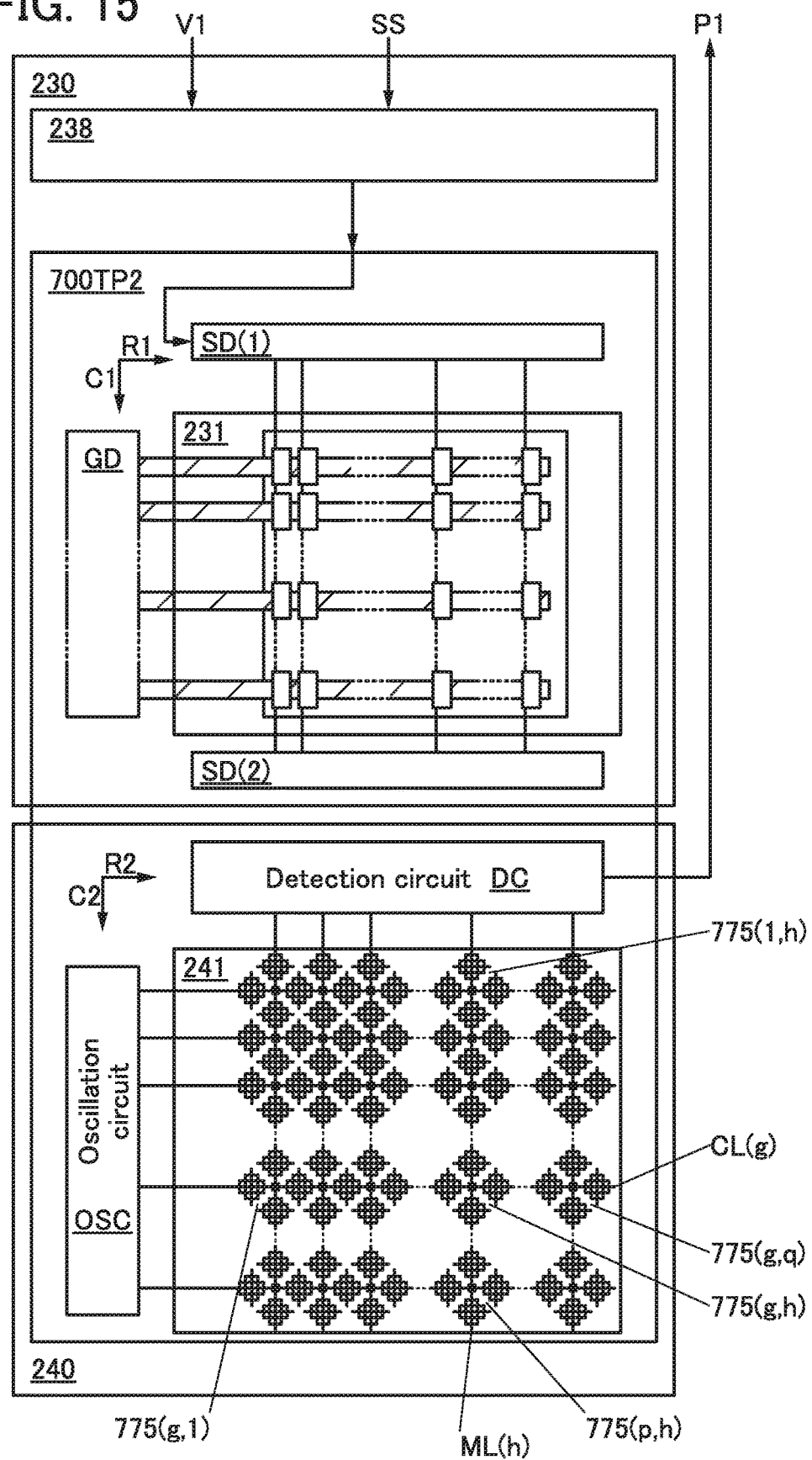
FIG. 15 is a block diagram illustrating the structure of an input/output device of an embodiment.

FIG. 15 is a block diagram illustrating the structure of the input/output device of one embodiment of the present invention.

Structure Example of Input/Output Device

The input/output device described in this embodiment includes a display portion 230 and an input portion 240 (see FIG. 15). For example, the display panel 700 described in Embodiment 2 can be used for the display portion 230.

The input portion 240 includes a sensing region 241 and has a function of sensing an object that approaches the sensing region 241.

The sensing region 241 includes a region overlapping with the pixel 702(i,j).

<<Input Portion 240>>

The input portion 240 includes a sensing region 241 and can include an oscillator circuit OSC and a detection circuit DC (see FIG. 15).

<<Sensing Region 241>>

The sensing region 241 can include one or a plurality of sensor elements, for example.

The sensing region 241 includes one group of sensor elements 775($g$,1) to 775($g$,$q$) and another group of sensor elements 775($l$,$h$) to 775($p$,$h$) (see FIG. 15). Note that g is an integer greater than or equal to 1 and less than or equal to p, h is an integer greater than or equal to 1 and less than or equal to q, and each of p and q is an integer greater than or equal to 1.

The one group of sensor elements 775($g$,1) to 775($g$,$q$) include the sensor element 775($g$,$h$) and are arranged in the row direction (indicated by the arrow R2 in the drawing). Note that the direction indicated by the arrow R2 in FIG. 15 may be the same as or different from the direction indicated by the arrow R1 in FIG. 15.

The group of sensor elements 775($l$,$h$) to 775($p$,$h$) include the sensor element 775($g$,$h$) and are provided in the column direction (indicated by the arrow C2 in the drawing) that intersects the row direction.

<<Sensor Element>>

A sensor element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensor element.

Alternatively, a plurality of kinds of sensor elements can be used in combination. For example, a sensor element that senses a finger and a sensor element that senses a stylus pen can be used in combination. This allows determination of the kind of a pointer. An instruction can be associated with sensing data depending on the kind of a pointer. Specifically, in the case where it is determined that a finger is used as a pointer, sensing data can be associated with a gesture.

In the case where it is determined that a stylus pen is used as a pointer, sensing data can be associated with drawing processing.

Specifically, a capacitive proximity sensor or an optical proximity sensor can be used to sense a finger. Alternatively, an electromagnetic inductive proximity sensor or an optical proximity sensor can be used to sense a stylus pen.

Note that this embodiment can be combined with any of the other embodiments in this specification as appropriate.

Embodiment 5

In this embodiment, the structure of a data processing device of one embodiment of the present invention is described with reference to FIGS. 16A to 16C, FIGS. 17A and 17B, and FIGS. 18A and 18B.

Figure 16A:
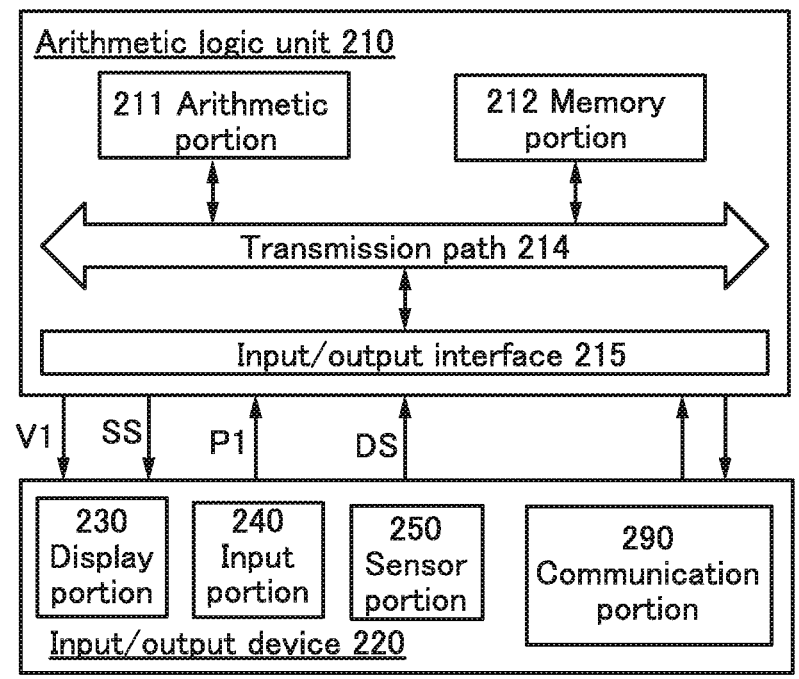
FIGS. 16A to 16C are a block diagram and projection views illustrating the structure of a data processing device of an embodiment.
Figure 16B:
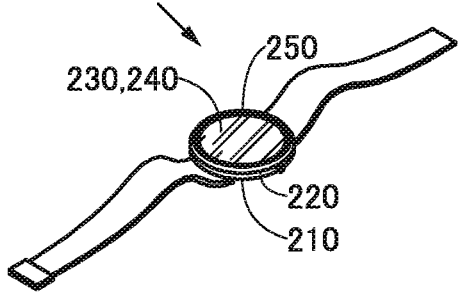
Figure 16C:
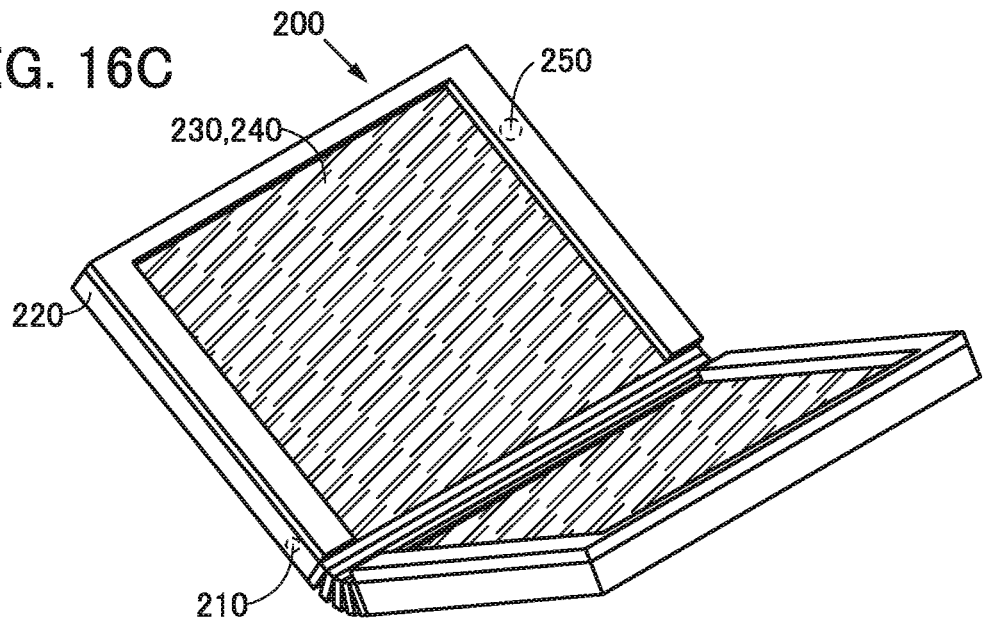

FIG. 16A is a block diagram illustrating the structure of the data processing device of one embodiment of the present invention. FIGS. 16B and 16C are projection views each illustrating an example of an external view of the data processing device 200.

Figure 17A:
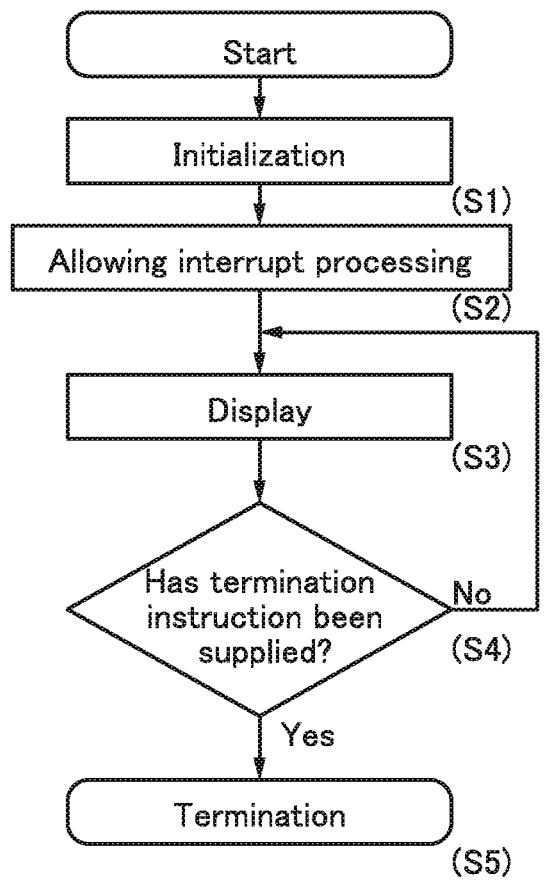
FIGS. 17A and 17B are a flow chart illustrating a method of driving a data processing device of an embodiment.
Figure 17B:
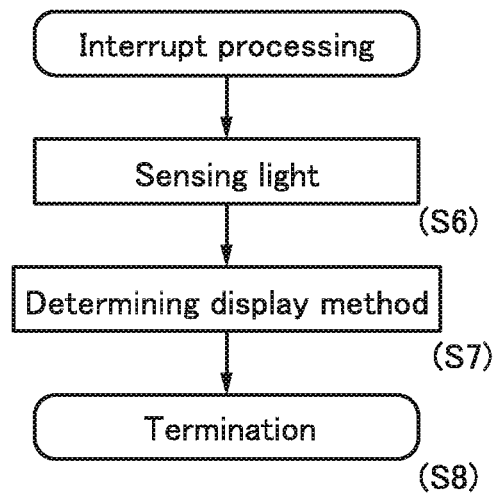

FIGS. 17A and 17B are flow charts showing a program of one embodiment of the present invention. FIG. 17A is a flow chart showing main processing of the program of one embodiment of the present invention. FIG. 17B is a flow chart showing interrupt processing.

Figure 18A:
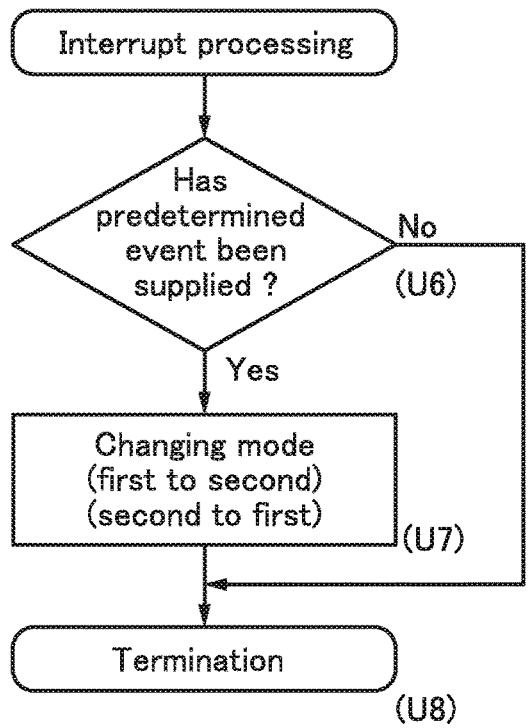
FIGS. 18A and 18B are a flow chart and a timing chart illustrating a method for driving a data processing device of an embodiment.
Figure 18B:
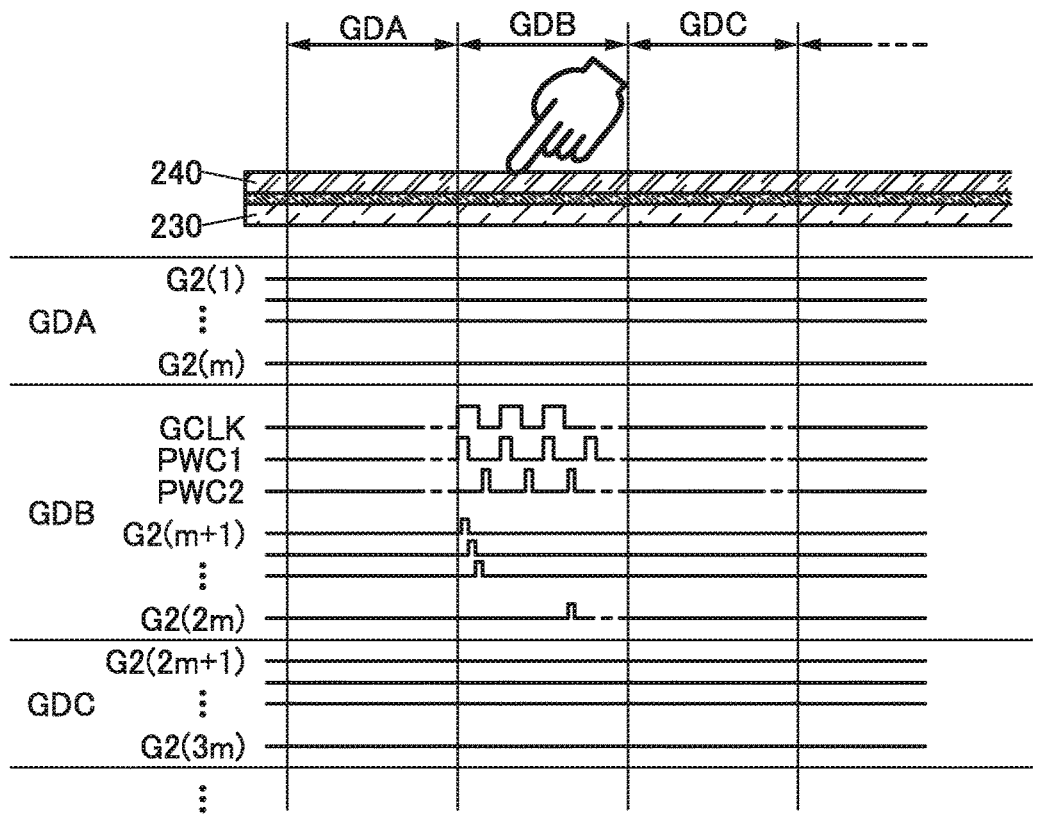

FIGS. 18A and 18B illustrate the program of one embodiment of the present invention. FIG. 18A is a flow chart showing interrupt processing of the program of one embodiment of the present invention. FIG. 18B is a timing chart showing the operation of the data processing device of one embodiment of the present invention.

Structure Example 1 of Data Processing Device

The data processing device 200 described in this embodiment includes an input/output device 220 and an arithmetic logic unit 210 (see FIG. 16A). The input/output device 220 is electrically connected to the arithmetic logic unit 210. Furthermore, the data processing device 200 can include a housing (see FIG. 16B or 16C).

The input/output device 220 includes the display portion 230 and the input portion 240 (see FIG. 16A). The input/output device 220 includes a sensor portion 250. The input/output device 220 can also include a communication portion 290.

The input/output device 220 has a function of receiving the image data V1 and the control data SS and a function of supplying the positional data P1 and sensing data DS.

The arithmetic logic unit 210 has a function of receiving the positional data P1 and the sensing data DS. The arithmetic logic unit 210 has a function of supplying the image data V1. The arithmetic logic unit 210 has a function of operating on the basis of the positional data P1 and the sensing data DS.

Note that the housing has a function of housing the input/output device 220 and/or the arithmetic logic unit 210. Alternatively, the housing has a function of supporting the display portion 230 and/or the arithmetic logic unit 210.

The display portion 230 has a function of displaying an image on the basis of the image data V1. The display portion 230 has a function of displaying an image on the basis of the control data SS.

The input portion 240 has a function of supplying the positional data P1.

The sensor portion 250 has a function of supplying the sensing data DS. The sensor portion 250 has a function of sensing the illuminance of the environment where the data processing device 200 is used and a function of supplying illuminance data, for example.

Thus, the data processing device can determine the intensity of light received by the housing of the data processing device and operate in a usage environment. A user of the data processing device can select a display method. Consequently, a novel data processing device with high convenience or high reliability can be provided.

Individual components included in the data processing device are described below. Note that these components cannot be clearly distinguished from each other and one component may also serve as another component or include part of another component. For example, a touch panel in which a touch sensor is provided to overlap with a display panel serves as an input portion as well as a display portion.

Structure Example

The data processing device 200 of one embodiment of the present invention includes a housing and the arithmetic logic unit 210.

The arithmetic logic unit 210 includes an arithmetic portion 211, a memory portion 212, a transmission path 214, and an input/output interface 215.

The data processing device of one embodiment of the present invention includes the input/output device 220.

The input/output device 220 includes the display portion 230, the input portion 240, the sensor portion 250, and the communication portion 290.

<<Data Processing Device>>

The data processing device of one embodiment of the present invention includes the arithmetic logic unit 210 and the input/output device 220.

<<Arithmetic Logic Unit 210>>

The arithmetic logic unit 210 includes the arithmetic portion 211 and the memory portion 212. The arithmetic logic unit 210 also includes the transmission path 214 and the input/output interface 215.

<<Arithmetic Portion 211>>

The arithmetic portion 211 has a function of executing a program, for example.

<<Memory Portion 212>>

The memory portion 212 has a function of, for example, storing a program executed by the arithmetic portion 211, initial data, setting data, an image, or the like.

Specifically, a hard disk, a flash memory, a memory including a transistor including an oxide semiconductor, or the like can be used for the memory portion 212.

<<Input/Output Interface 215 and Transmission Path 214>>

The input/output interface 215 includes a terminal and a wiring and has a function of supplying and receiving data. The input/output interface 215 can be electrically connected to the transmission path 214 and the input/output device 220, for example.

The transmission path 214 includes a wiring and has a function of supplying and receiving data. For example, the transmission path 214 can be electrically connected to the input/output interface 215. In addition, the transmission path 214 can be electrically connected to the arithmetic portion 211 and the memory portion 212.

<<Input/Output Device 220>>

The input/output device 220 includes the display portion 230, the input portion 240, the sensor portion 250, and the communication portion 290. For example, the input/output device described in Embodiment 4 can be used. In that case, power consumption can be reduced.

<<Display Portion 230>>

The display portion 230 includes the control portion 238, the driver circuit GD, the driver circuit SD, and the display panel 700B (see FIG. 14A). For example, any of the display devices described in Embodiment 3 can be used for the display portion 230.

<<Input Portion 240>>

Any of a variety of human interfaces or the like can be used as the input portion 240 (see FIGS. 16A to 16C).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor having a region overlapping with the display portion 230 can be referred to as a touch panel or a touch screen.

For example, a user can make various gestures (e.g., tap, drag, swipe, and pinch in) using his/her finger as a pointer on the touch panel.

The arithmetic logic unit 210, for example, analyzes data on the position, track, or the like of the finger on the touch panel and determines that a specific gesture is supplied when the analysis results meet predetermined conditions. Therefore, the user can supply a certain operation instruction associated with a predetermined gesture by using the gesture.

For instance, the user can supply a "scrolling instruction" for changing a portion where image data is displayed by using a gesture of touching and moving his/her finger on the touch panel.

<<Sensor Portion 250>>

The sensor portion 250 has a function of sensing the ambient conditions and supplying the sensing data. Specifically, the sensor portion 250 can supply illuminance data, attitude data, pressure data, positional data, and the like.

For example, a photosensor, an attitude sensor, an acceleration sensor, a direction sensor, a global positioning system (GPS) signal receiving circuit, a pressure sensor, a temperature sensor, a humidity sensor, a camera, or the like can be used as the sensor portion 250.

<<Communication Portion 290>>

The communication portion 290 has a function of supplying and acquiring data to/from a network.

<<Program>>

The program of one embodiment of the present invention has the following steps (see FIG. 17A).

[First Step]

In a first step, setting is initialized (see S1 in FIG. 17A).

For example, predetermined image data which is to be displayed on start-up and data for determining a predetermined mode of displaying the image data and a predetermined method of displaying the image data are acquired from the memory portion 212. Specifically, still image data or moving image data can be used as the predetermined image data. Furthermore, a first mode or a second mode can be used as the predetermined mode.

[Second Step]

In a second step, interrupt processing is allowed (see S2 in FIG. 17A). Note that an arithmetic logic unit allowed to execute the interrupt processing can perform the interrupt processing in parallel with the main processing. The arithmetic logic unit which has returned from the interrupt processing to the main processing can reflect the results of the interrupt processing in the main processing.

The arithmetic logic unit may execute the interrupt processing when a counter has an initial value, and the counter may be set at a value other than the initial value when the arithmetic logic unit returns from the interrupt processing. Thus, the interrupt processing is ready to be executed after the program is started up.

[Third Step]

In a third step, image data is displayed in a predetermined mode or a predetermined display method selected in the first step or the interrupt processing (see S3 in FIG. 17A). Note that the predetermined mode identifies a mode for displaying the image data, and the predetermined display method identifies a method for displaying image data. For example, the image data V1 can be used for data to be displayed.

For example, a method for displaying the image data V1 can be associated with the first mode. Another method for displaying the image data V1 can be associated with the second mode. Thus, a display method can be selected on the basis of the selected mode.

<<First Mode>>

Specifically, a method of supplying selection signals to a scan line at a frequency of 30 Hz or more, preferably 60 Hz or more, and performing display on the basis of the selection signals can be associated with the first mode.

For example, the supply of selection signals at a frequency of 30 Hz or more, preferably 60 Hz or more, enables display of a smooth moving image.

For example, an image is refreshed at a frequency of 30 Hz or more, preferably 60 Hz or more, so that an image smoothly following the user's operation can be displayed on the data processing device 200 the user operates.

<<Second Mode>>

Specifically, a method of supplying selection signals to a scan line at a frequency of less than 30 Hz, preferably less than 1 Hz, more preferably less than once a minute and performing display on the basis of the selection signals can be associated with the second mode.

The supply of selection signals at a frequency of less than 30 Hz, preferably less than 1 Hz, more preferably less than once a minute, enables display of an image with reduced flickering. Furthermore, power consumption can be reduced.

For example, when the data processing device 200 is used for a clock or watch, the display can be refreshed at a frequency of once a second, once a minute, or the like.

For example, when a light-emitting element is used as the display element, the light-emitting element can be made to emit light in a pulsed manner so as to display image data. Specifically, an organic EL element can be made to emit light in a pulsed manner, and its afterglow can be used to display image data. An organic EL element has excellent frequency characteristics; therefore, time for driving the light-emitting element can be shortened and thus power consumption can be reduced in some cases. Heat generation can be inhibited, and thus the deterioration of the light-emitting element can be suppressed in some cases.

[Fourth Step]

In a fourth step, the next step is determined as follows: a fifth step is selected when a termination instruction has been supplied, whereas the third step is selected when the termination instruction has not been supplied (see S4 in FIG. 17A).

For example, the termination instruction supplied in the interrupt processing can be used to determine the next step.

[Fifth Step]

In the fifth step, the program terminates (see S5 in FIG. 17A).

<<Interrupt Processing>>

The interrupt processing includes sixth to eighth steps described below (see FIG. 17B).

[Sixth Step]

In the sixth step, the illuminance of the environment where the data processing device 200 is used can be sensed using the sensor portion 250, for example (see S6 in FIG. 17B). Note that the color temperature or chromaticity of ambient light can be sensed instead of the illuminance of the environment.

[Seventh Step]

In the seventh step, a display method is determined on the basis of the sensed illuminance data (see S7 in FIG. 17B). For example, a display method is determined such that the brightness of display is not too bright or too dark.

In the case where the color temperature or chromaticity of the ambient light is sensed in the sixth step, the color of display may be adjusted.

[Eighth Step]

In the eighth step, the interrupt processing terminates (see S8 in FIG. 17B).

Structure Example 2 of Data Processing Device

Another structure of the data processing device of one embodiment of the present invention is described with reference to FIGS. 18A and 18B.

FIG. 18A is a flow chart showing a program of one embodiment of the present invention. The interrupt processing in the flow chart in FIG. 18A is different from that in FIG. 17B.

Note that the structure example 3 of the data processing device is different from the interrupt processing in FIG. 17B in that the interrupt processing includes a step in which a mode is changed on the basis of a supplied predetermined event. Different structures are described in detail below, and the above description is referred to for the similar portions.

<<Interrupt Processing>>

The interrupt processing includes sixth to eighth steps described below (see FIG. 18A).

[Sixth Step]

In the sixth step, the processing proceeds to the seventh step when a predetermined event has been supplied, whereas the processing proceeds to the eighth step when the predetermined event has not been supplied (see U6 in FIG. 18A). For example, whether the predetermined event is supplied in a predetermined period or not can be a branch condition. Specifically, the predetermined period can be longer than 0 second and shorter than or equal to 5 seconds, preferably shorter than or equal to 1 second, more preferably shorter than or equal to 0.5 seconds, still more preferably shorter than or equal to 0.1 seconds.

[Seventh Step]

In the seventh step, the mode is changed (see U7 in FIG. 18A). Specifically, the mode is changed to the second mode when the first mode has been selected, or the mode is changed to the first mode when the second mode has been selected.

For example, a display mode of part of a region in the display portion 230 can be changed. Specifically, a display mode of a region where one driver circuit in the display portion 230 including the driver circuit GDA, the driver circuit GDB, and a driver circuit GDC supplies a selection signal can be changed (see FIG. 18B).

For example, when a predetermined event is supplied to the input portion 240 in a region overlapping with a region to which the driver circuit GDB supplies a selection signal, a display mode of the region to which the driver circuit GDB supplies a selection signal can be changed. Specifically, in accordance with an event supplied to a touch panel with a finger or the like (e.g., "tap"), the frequency of the selection signal supplied by the driver circuit GDB can be changed. Thus, for example, the driver circuit GDB can supply a selection signal without supply of selection signals by the driver circuits GDA and GDC. Furthermore, display of a region to which a selection signal is supplied by the driver circuit GDB can be refreshed without changing display of regions to which selection signals are supplied by the driver circuits GDA and GDC. Furthermore, power consumed by the driver circuit can be reduced.

[Eighth Step]

In the eighth step, the interrupt processing terminates (see U8 in FIG. 18A). Note that in a period in which the main processing is executed, the interrupt processing may be repeatedly executed.

<<Predetermined Event>>

For example, the following events can be used: events supplied using a pointing device such as a mouse (e.g., "click" and "drag") and events supplied to a touch panel with a finger or the like used as a pointer (e.g., "tap", "drag", and "swipe").

Furthermore, for example, the position of a slide bar pointed by a pointer, the swipe speed, and the drag speed can be used as parameters assigned to an instruction associated with a predetermined event.

For example, data sensed by the sensor portion 250 is compared to a predetermined threshold value, and the compared results can be used for the event.

Specifically, a pressure sensor or the like in contact with a button or the like that can be pushed in a housing can be used as the sensor portion 250.

<<Instruction Associated with Predetermined Event>>

For example, the termination instruction can be associated with a predetermined event.

For example, "page-turning instruction" for switching displayed image data from one to another can be associated with a predetermined event. Note that a parameter for determining the page-turning speed or the like when the "page-turning instruction" is executed can be supplied using the predetermined event.

For example, "scroll instruction" for moving the display position of part of image data and displaying another part continuing from that part can be associated with a predetermined event. Note that a parameter for determining the moving speed of the display position, or the like, when the "scroll instruction" is executed can be supplied using the predetermined event.

For example, an instruction for setting the display method or an instruction for generating image data can be associated with a predetermined event. Note that a parameter for determining the brightness of a generated image can be associated with a predetermined event. Note that a parameter for determining the brightness of a generated image may be determined on the basis of ambient brightness sensed by the sensor portion 250.

For example, an instruction for acquiring data distributed via a push service using the communication portion 290 can be associated with a predetermined event.

Note that positional data sensed by the sensor portion 250 may be used for the determination of the presence or absence of a qualification for acquiring data. Specifically, it may be determined that there is a qualification for acquiring data when a user is in a predetermined class room, school, conference room, office, building, or the like. For example, educational materials can be fed from a classroom of a school or a university, so that the data processing device 200 can be used as a schoolbook or the like (see FIG. 16C). Alternatively, materials distributed from a conference room in, for example, a company can be received and used for a conference material.

Note that this embodiment can be combined with any of the other embodiments in this specification as appropriate.

Embodiment 6

In this embodiment, structures of a data processing devices of one embodiment of the present invention are described with reference to FIGS. 19A to 19E and FIGS. 20A to 20E.

Figure 19A:
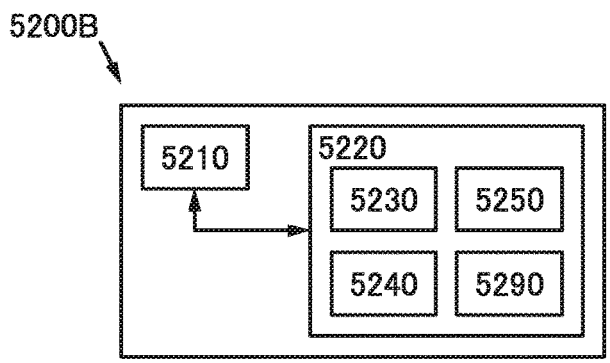
FIGS. 19A to 19E are diagrams illustrating structures of a data processing device of an embodiment.

FIGS. 19A to 19E and FIGS. 20A to 20E illustrate structures of the data processing device of one embodiment of the present invention. FIG. 19A is a block diagram of the data processing device, and FIGS. 19B to 19E are perspective views illustrating the structures of the data processing device. FIGS. 20A to 20E are perspective views illustrating the structures of the data processing device.

<<Data Processing Device>>

A data processing device 5200B described in this embodiment includes an arithmetic logic unit 5210 and an input/output device 5220 (see FIG. 19A).

The arithmetic logic unit 5210 has a function of receiving operation data and a function of supplying image data on the basis of the operation data.

The input/output device 5220 includes a display portion 5230, an input portion 5240, a sensor portion 5250, and a communication portion 5290 and has a function of supplying operation data and a function of receiving image data. The input/output device 5220 also has a function of supplying sensing data, a function of supplying communication data, and a function of receiving communication data.

The input portion 5240 has a function of supplying operation data. For example, the input portion 5240 supplies operation data on the basis of operation by the user of the data processing device 5200B.

Specifically, a keyboard, a hardware button, a pointing device, a touch sensor, an audio input device, an eye-gaze input device, or the like can be used as the input portion 5240.

The display portion 5230 includes a display panel and has a function of displaying image data. For example, the display panel described in Embodiment 2 can be used for the display portion 5230.

The sensor portion 5250 has a function of supplying sensing data. For example, the sensor portion 5250 has a function of sensing a surrounding environment where the data processing device is used and supplying sensing data.

Specifically, an illuminance sensor, an imaging device, an attitude determination device, a pressure sensor, a human motion sensor, or the like can be used as the sensor portion 5250.

The communication portion 5290 has a function of receiving and supplying communication data. For example, the communication portion 5290 has a function of being connected to another electronic device or a communication network through wireless communication or wired communication. Specifically, the communication portion 5290 has a function of wireless local area network communication, telephone communication, or near field communication, for example.

Structure Example 1 of Data Processing Device

Figure 19B:
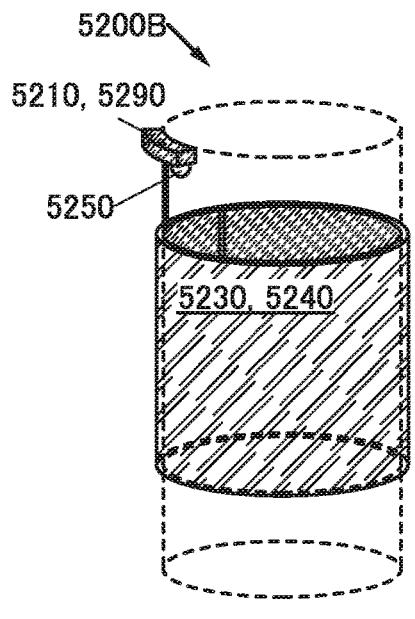

For example, the display portion 5230 can have an outer shape along a cylindrical column (see FIG. 19B). The display portion 5230 can change its display method in accordance with the illuminance of a usage environment. In addition, the display portion 5230 can change the displayed content in response to sensed existence of a person. This allows the data processing device 5200B to be provided on a column of a building, for example. The data processing device 5200B can display advertising, guidance, or the like. The data processing device 5200B can be used for digital signage or the like.

Structure Example 2 of Data Processing Device

Figure 19C:
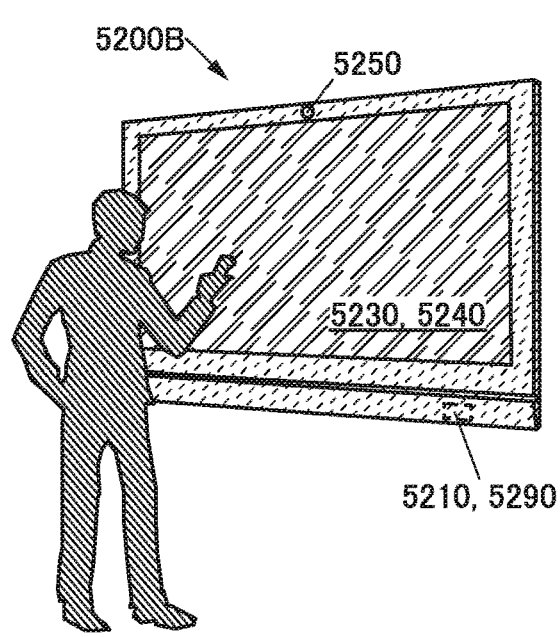

For example, the data processing device 5200B has a function of generating image data on the basis of the path of a pointer used by a user (see FIG. 19C). Specifically, the display panel with a diagonal size of 20 inches or longer, preferably 40 inches or longer, more preferably 55 inches or longer can be used. Alternatively, a plurality of display panels can be arranged in one display region. Alternatively, a plurality of display panels can be arranged and used for multiscreen. Thus, the data processing device 5200B can be used for an electronic blackboard, an electronic bulletin board, or digital signage, for example.

Structure Example 3 of Data Processing Device

Figure 19D:
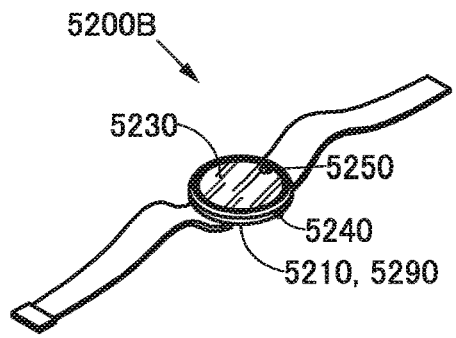

For example, the data processing device 5200B has a function of changing a display method in accordance with the illuminance of a usage environment (see FIG. 19D). Thus, it is possible to obtain a smartwatch with reduced power consumption, for example. Alternatively, it is possible to obtain a smartwatch that can display an image such that the smartwatch is favorably used even in an environment with intense external light, e.g., in the open air under fine weather.

Structure Example 4 of Data Processing Device

Figure 19E:
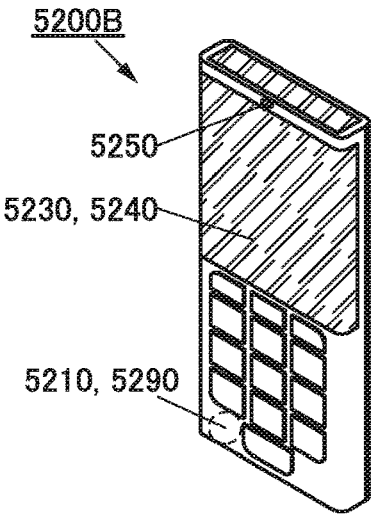

For example, the display portion 5230 has a surface gently curved along a side surface of a housing (see FIG. 19E). The display portion 5230 includes a display panel that can display an image on the front surface, the side surfaces, and the top surface, for example. Accordingly, image data can be displayed on the side surfaces and the top surface of a mobile phone in addition to the front surface, for example.

Structure Example 5 of Data Processing Device

Figure 20A:
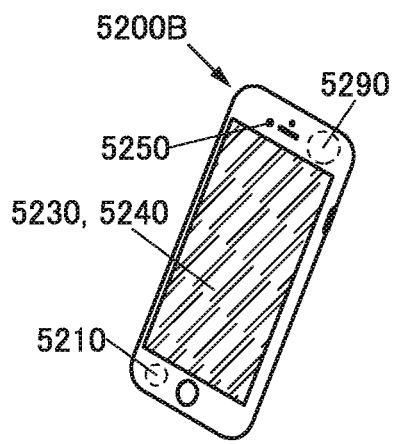
FIGS. 20A to 20E are diagrams illustrating structures of a data processing device of an embodiment.

For example, the data processing device 5200B has a function of changing a display method in accordance with the illuminance of a usage environment (see FIG. 20A). Thus, it is possible to obtain a smartphone with reduced power consumption. Alternatively, it is possible to obtain a smartphone that can display an image such that the smartphone is favorably used even in an environment with intense external light, e.g., in the open air under fine weather.

Structure Example 6 of Data Processing Device

Figure 20B:
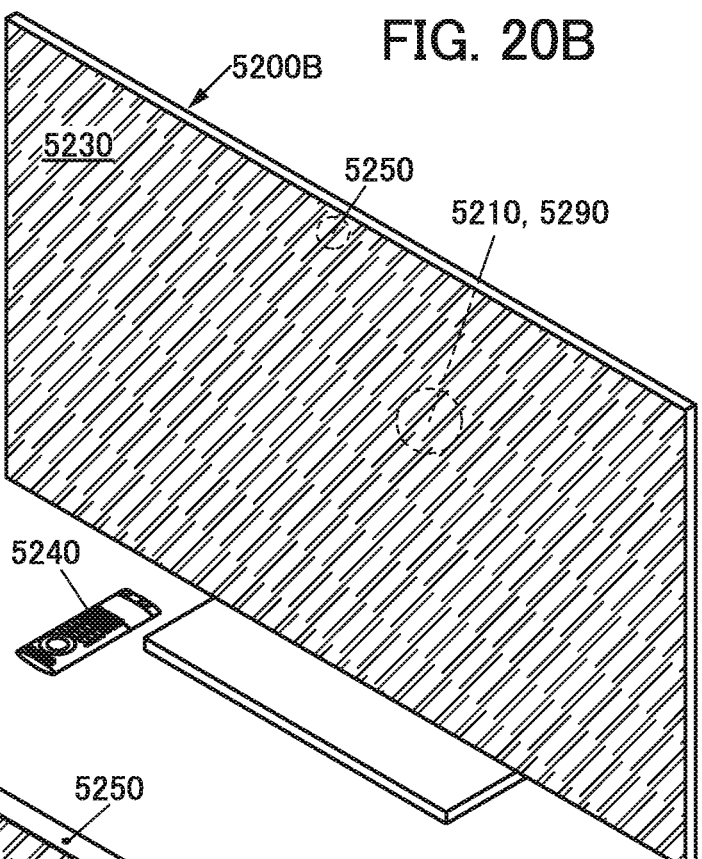

For example, the data processing device 5200B has a function of changing a display method in accordance with the illuminance of a usage environment (see FIG. 20B). Thus, it is possible to obtain a television system that can display an image such that the television system is favorably used even when exposed to intense external light poured into a room in a sunny day.

Structure Example 7 of Data Processing Device

Figure 20C:
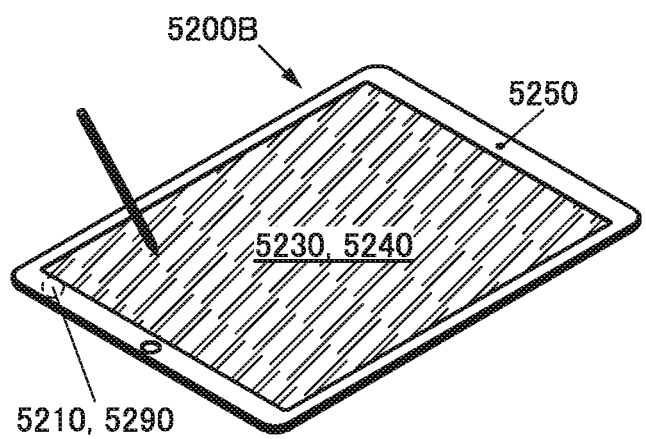

For example, the data processing device 5200B has a function of changing a display method in accordance with the illuminance of a usage environment (see FIG. 20C). Thus, it is possible to obtain a tablet computer that can display an image such that the tablet computer is favorably used even in an environment with intense external light, e.g., in the open air under fine weather.

Structure Example 8 of Data Processing Device

Figure 20D:
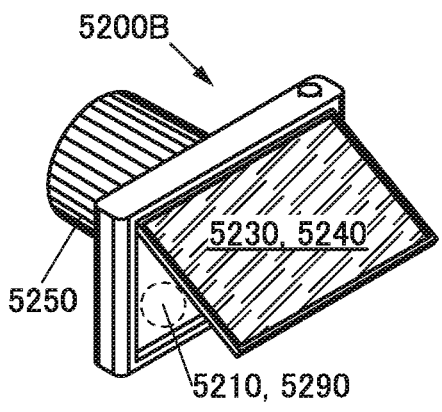

For example, the data processing device 5200B has a function of changing a display method in accordance with the illuminance of a usage environment (see FIG. 20D). Thus, it is possible to obtain a digital camera that can display a subject such that an image is favorably viewed even in an environment with intense external light, e.g., in the open air under fine weather.

Structure Example 9 of Data Processing Device

Figure 20E:
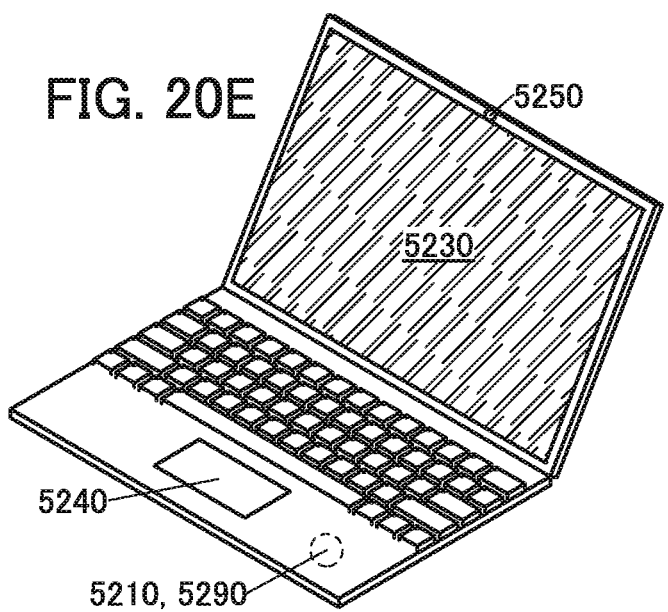

For example, the data processing device 5200B has a function of changing a display method in accordance with the illuminance of a usage environment (see FIG. 20E). Thus, it is possible to obtain a personal computer that can display an image such that the personal computer is favorably used even in an environment with intense external light, e.g., in the open air under fine weather.

Note that this embodiment can be combined with any of the other embodiments in this specification as appropriate.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X through at least Z1 on a first connection path, the first connection path does not include a second connection path, the second connection path includes a connection path through which the transistor is provided, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that one embodiment of the present invention is not limited to these expressions that are just examples. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

REFERENCE NUMERALS

AF1: alignment film, AF2: alignment film, ALU: arithmetic logic unit, AMP: amplifier, BA: buffer amplifier, CF: coloring film, DAC: digital-to-analog converter circuit, DC: sensor circuit, DS: sensing data, GD: driver circuit, GDA: driver circuit, GDB: driver circuit, GDC: driver circuit, GDD: driver circuit, G1: scan line, KB1: structure body, LTC: latch circuit, M: transistor, N3: node, OSC: an oscillator circuit, OUT1: output terminal, OUT2: output terminal, P1: positional data, PTL: logic circuit, R1: arrow, R2: arrow, S1: signal line, SD: driver circuit, SR: selection circuit, SS: control data, SW1: switch, Tm11: terminal, Tm12: terminal, Tm13: terminal, Tm21: terminal, Tm22: terminal, V1: image data, V11: data, 10C: operational amplifier, 13: switch, 14: operational amplifier, 20: offset adjustment circuit, 21: level shifter, 22: register, 23: tri-state buffer, 100: semiconductor device, 100B: semiconductor device, 119: terminal, 120: terminal region, 120A: region, 120B: region, 200: data processing device, 210: arithmetic logic unit, 211: arithmetic portion, 212: the memory portion, 214: transmission path, 215: input/output interface, 220: input/output device, 230: display portion, 231: display region, 233: timing controller, 234: decompression circuit, 235M: image processing circuit, 238: control portion, 240: input portion, 241: sensing region, 250: sensor portion, 290: communication portion, 501C: insulating film, 504: conductive film, 506: insulating film, 508: semiconductor film, 508A: region, 508B: region, 508C: region, 510: substrate, 512A: conductive film, 512B: conductive film, 516: insulating film, 519B: terminal, 520: functional layer, 521: insulating film, 521A: insulating film, 521B: insulating film, 524: conductive film, 528: insulating film, 530: pixel circuit, 550: display element, 551: electrode, 552: electrode, 553: layer containing a light-emitting material, 578: drying agent, 591A: connection portion, 591B: connection portion, 700: display panel, 700B: display panel, 702: pixel, 703: pixel, 720: functional layer, 750: display element, 751: electrode, 752: electrode, 753: layer containing a liquid crystal material, 770: substrate, 770D: functional film, 770P: functional film, 771: insulating film, 775: sensor element, 5200B: data processing device, 5210: arithmetic logic unit, 5220: input/output device, 5230: display portion, 5240: input portion, 5250: sensor portion, and 5290: communication portion.

This application is based on Japanese Patent Application Serial No. 2017-027201 filed with Japan Patent Office on Feb. 16, 2017, the entire contents of which are hereby incorporated by reference.

The invention claimed is:

1. A semiconductor device comprising:
an arithmetic logic unit;
a first D/A converter circuit electrically connected to the arithmetic logic unit; and
an amplifier electrically connected to the first D/A converter circuit,
wherein the arithmetic logic unit is configured to generate second data on the basis of first data and one of an offset adjustment signal and offset data,
wherein the first D/A converter circuit is configured to supply an analog signal to the amplifier on the basis of the second data,
wherein the amplifier comprises:
an operational amplifier electrically connected to a first terminal, a second terminal, and a node,
a switch between the node and the second terminal; and
an offset adjustment circuit electrically connected to the node,
wherein the operational amplifier is configured to supply a first voltage to the node on the basis of a voltage between the first terminal and the second terminal,
wherein the switch is configured to control an electrical connection between the node and the second terminal on the basis of an output enable signal,
wherein the offset adjustment circuit is configured to supply the offset adjustment signal and the offset data,
wherein the offset adjustment circuit comprises:
a register configured to be supplied with the offset adjustment signal and a latch signal; and
a level shifter between the node and the register,
wherein the level shifter is configured to supply the latch signal to the register on the basis of the output enable signal,
wherein the register is configured to supply the offset adjustment signal when the register is in a passage state,
wherein the register is configured to retain, as the offset data, the offset adjustment signal on the basis of the latch signal, and
wherein the register is configured to supply the offset data when the register is in a non-passage state.

2. The semiconductor device according to claim 1, further comprising:
a latch circuit between the arithmetic logic unit and the first D/A converter circuit; and
a second selection circuit configured to supply a second selection signal to the latch circuit,
wherein the latch circuit is configured to retain the second data on the basis of the second selection signal, and
wherein the latch circuit is configured to supply the second data when the latch circuit is in a non-passage state.

3. The semiconductor device according to claim 1, further comprising a terminal region comprising a plurality of terminals,
wherein the second terminal is electrically connected to one of the plurality of terminals.

4. The semiconductor device according to claim 1, further comprising:
a terminal region comprising a plurality of terminals; and
a buffer amplifier comprising a fourth terminal and a fifth terminal,
wherein the first terminal is electrically connected to a first output terminal of the first D/A converter circuit,
wherein the second terminal is electrically connected to one of the plurality of terminals,
wherein the fourth terminal is electrically connected to a second output terminal of the first D/A converter circuit, and
wherein the fifth terminal is electrically connected to another one of the plurality of terminals.

5. A display panel comprising:
the semiconductor device according to claim 1; and
a display region comprising a signal line,
wherein the signal line is electrically connected to the second terminal of the semiconductor device.

6. A display panel comprising:
the semiconductor device according to claim 1;
a display region comprising a signal line;
a buffer amplifier comprising a sixth terminal and a seventh terminal; and
a second D/A converter circuit electrically connected to the sixth terminal,
wherein the signal line is electrically connected to the second terminal of the semiconductor device and the seventh terminal of the buffer amplifier.

7. A display device comprising:
a display panel comprising the semiconductor device according to claim 1 and a display region comprising a signal line; and
a control portion configured to supply image data and control data to the display panel,
wherein the signal line is electrically connected to the second terminal of the semiconductor device.

8. An input/output device comprising:
the semiconductor device according to claim 1;
a display region comprising a signal line; and
an input portion comprising a sensing region,
wherein the signal line is electrically connected to the second terminal of the semiconductor device.

9. A data processing device comprising:
the semiconductor device according to claim 1;
a display region comprising a signal line; and
at least one of a keyboard, a hardware button, a pointing device, a touch sensor, an illuminance sensor, an imaging device, an audio input device, an eye-gaze input device, and an attitude determination device,
wherein the signal line is electrically connected to the second terminal of the semiconductor device.

10. A semiconductor device comprising:
an arithmetic logic unit;
a first D/A converter circuit electrically connected to the arithmetic logic unit;
an amplifier electrically connected to the first D/A converter circuit; and
a first selection circuit configured to supply a first selection signal to the offset adjustment circuit,
wherein the arithmetic logic unit is configured to generate second data on the basis of first data and one of an offset adjustment signal and offset data, wherein the first D/A converter circuit is configured to supply an analog signal to the amplifier on the basis of the second data, wherein the amplifier comprises:
an operational amplifier electrically connected to a first terminal, a second terminal, and a node,
a switch between the node and the second terminal; and
an offset adjustment circuit electrically connected to the node, wherein the operational amplifier is configured to supply a first voltage to the node on the basis of a voltage between the first terminal and the second terminal, wherein the switch is configured to control an electrical connection between the node and the second terminal on the basis of an output enable signal, wherein the offset adjustment circuit is configured to supply the offset adjustment signal and the offset data, wherein the offset adjustment circuit comprises:
a register configured to be supplied with the offset adjustment signal and a latch signal;
a level shifter between the node and the register; and
a tri-state buffer between the register and a third terminal, wherein the level shifter is configured to supply the latch signal to the register on the basis of the output enable signal, wherein the register is configured to supply the offset adjustment signal when the register is in a passage state, wherein the register is configured to retain, as the offset data, the offset adjustment signal on the basis of the latch signal, wherein the register is configured to supply the offset data when the register is in a non-passage state, and wherein the tri-state buffer is configured to supply the offset adjustment signal or the offset data to the third terminal on the basis of the first selection signal.

11. The semiconductor device according to claim 10, further comprising:
a latch circuit between the arithmetic logic unit and the first D/A converter circuit; and
a second selection circuit configured to supply a second selection signal to the latch circuit, wherein the latch circuit is configured to retain the second data on the basis of the second selection signal, and wherein the latch circuit is configured to supply the second data when the latch circuit is in a non-passage state.

12. The semiconductor device according to claim 10, further comprising a terminal region comprising a plurality of terminals, wherein the second terminal is electrically connected to one of the plurality of terminals.

13. The semiconductor device according to claim 10, further comprising:
a terminal region comprising a plurality of terminals; and
a buffer amplifier comprising a fourth terminal and a'fifth terminal, wherein the first terminal is electrically connected to a first output terminal of the first D/A converter circuit, wherein the second terminal is electrically connected to one of the plurality of terminals, wherein the fourth terminal is electrically connected to a second output terminal of the first D/A converter circuit, and wherein the fifth terminal is electrically connected to another one of the plurality of terminals.

14. A display panel comprising:
the semiconductor device according to claim 10; and
a display region comprising a signal line, wherein the signal line is electrically connected to the second terminal of the semiconductor device.

15. A display panel comprising:
the semiconductor device according to claim 10;
a display region comprising a signal line;
a buffer amplifier comprising a sixth terminal and a seventh terminal; and
a second D/A converter circuit electrically connected to the sixth terminal, wherein the signal line is electrically connected to the second terminal of the semiconductor device and the seventh terminal of the buffer amplifier.

16. A display device comprising:
a display panel comprising the semiconductor device according to claim 10 and a display region comprising a signal line; and
a control portion configured to supply image data and control data to the display panel, wherein the signal line is electrically connected to the second terminal of the semiconductor device.

17. An input/output device comprising:
the semiconductor device according to claim 10;
a display region comprising a signal line; and
an input portion comprising a sensing region, wherein the signal line is electrically connected to the second terminal of the semiconductor device.

18. A data processing device comprising:
the semiconductor device according to claim 10;
a display region comprising a signal line; and
at least one of a keyboard, a hardware button, a pointing device, a touch sensor, an illuminance sensor, an imaging device, an audio input device, an eye-gaze input device, and an attitude determination device, wherein the signal line is electrically connected to the second terminal of the semiconductor device.

* * * * *